(12) United States Patent
Jun

(10) Patent No.: US 8,247,816 B2
(45) Date of Patent: Aug. 21, 2012

(54) THIN FILM TRANSISTOR ARRAY PANEL

(75) Inventor: Sahng-Ik Jun, Seoul (KR)

(73) Assignee: Samsung Electronic Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 12/195,239

(22) Filed: Aug. 20, 2008

(65) Prior Publication Data
US 2008/0303025 A1   Dec. 11, 2008

Related U.S. Application Data

(62) Division of application No. 11/266,680, filed on Nov. 3, 2005, now abandoned.

(30) Foreign Application Priority Data

Nov. 3, 2004  (KR) .......................... 10-2004-0088812

(51) Int. Cl.
H01L 29/04 (2006.01)
(52) U.S. Cl. ............ 257/59; 257/72; 257/290; 257/291; 257/292
(58) Field of Classification Search ............ 257/72, 257/59, 222, 225, 258, 291
See application file for complete search history.

(56) References Cited

U.S. PATENT DOCUMENTS

| | | | | |
|---|---|---|---|---|
| 5,285,301 A * | 2/1994 | Shirahashi et al. | ........... | 349/143 |
| 5,402,254 A * | 3/1995 | Sasano et al. | .................. | 349/38 |
| 6,411,358 B2 * | 6/2002 | Song et al. | ................... | 349/141 |
| 6,555,876 B2 * | 4/2003 | Jun et al. | ........................ | 257/350 |
| 6,639,281 B2 * | 10/2003 | Kane et al. | ..................... | 257/350 |
| 6,864,935 B2 * | 3/2005 | Kim et al. | ..................... | 349/129 |
| 6,882,376 B2 * | 4/2005 | Kim et al. | ........................ | 349/43 |
| 6,900,872 B2 * | 5/2005 | Kang | ............................ | 349/141 |
| 7,894,026 B2 * | 2/2011 | Kim et al. | ..................... | 349/111 |
| 2002/0039161 A1 * | 4/2002 | Kim | ............................... | 349/129 |
| 2003/0042482 A1 * | 3/2003 | Jun et al. | ........................ | 257/40 |
| 2005/0098781 A1 * | 5/2005 | Park et al. | ....................... | 257/59 |

FOREIGN PATENT DOCUMENTS

| | | |
|---|---|---|
| CN | 1488083 | 4/2004 |
| JP | 02-285326 | 11/1990 |
| JP | 2002-149086 | 5/2002 |
| JP | 2004-134504 | * 4/2004 |
| KR | 10-0288775 | 2/2001 |
| KR | 100370800 | 1/2003 |
| KR | 1020030018620 | 3/2003 |

OTHER PUBLICATIONS

Machine translation of JP2004-134504 has been attached.*

* cited by examiner

*Primary Examiner* — Marcos D. Pizarro
*Assistant Examiner* — Bilkis Jahan
(74) *Attorney, Agent, or Firm* — F. Chau & Associates, LLC

(57) ABSTRACT

A thin film transistor array panel according to an embodiment of the present invention includes: a gate electrode; a semiconductor layer; a gate insulating layer disposed between the gate electrode and the semiconductor layer; a source electrode connected to the semiconductor layer; and a drain electrode connected to the semiconductor layer, spaced apart from the source electrode, and including two branches overlapping the gate electrode, wherein the two branches of the drain electrode are spaced apart from each other and lie on a straight line or on two parallel straight lines.

25 Claims, 16 Drawing Sheets

THIN FILM TRANSISTOR ARRAY PANEL

CROSS-REFERENCE TO RELATED APPLICATION

This is a Divisional Application of U.S. application Ser. No. 11/266,680 filed on Nov. 3, 2005, now abandoned which claims priority from Korean Patent Application No. 10-2004-0088812 filed on Nov. 3, 2004, the disclosures of which are incorporated herein by reference in their entirety.

BACKGROUND OF THE INVENTION

1. Field of the Invention

The present invention relates to a thin film transistor array panel.

2. Description of Related Art

An active type display device such as a liquid crystal display (LCD) and an organic light emitting diode (OLED) display includes a plurality of pixels arranged in a matrix and including field generating electrodes and switching elements. The switching elements include thin film transistors (TFTs) having three terminals, gate, source, and drain. The TFT of each pixel selectively transmits data signals to a field-generating electrode in response to gate signals.

The display device further includes a plurality of signal lines for transmitting signals to the switching elements, which includes gate lines transmitting gate signals and data lines transmitting data signals.

The LCD and the OLED include a panel provided with TFTs, field-generating electrodes, and signal lines, which is referred to as a TFT array panel.

The TFT array panel has a layered structure that includes several conductive layers and insulating layers. Gate lines, data lines, and field-generating electrodes are formed of different conductive layers and separated by insulating layers.

When an active area on a backplane for LCDs is too large to use an exposure mask, the entire exposure is accomplished by repeating a divisional exposure called step-and-repeat process. One divisional exposure unit or area is called a shot. Since transition, rotation, and distortion are generated during light exposure, the shots are not aligned accurately. Accordingly, parasitic capacitances generated between signal lines and pixel electrodes differ depending on the shots, and this causes the luminance difference between the shots, which is recognized at the pixels located at a boundary between the shots. Therefore, the stitch defect is generated on the screen of the LCD due to luminance discontinuity between the shots. In addition, the difference in the parasitic capacitance causes the difference in the kickback voltage to yield flickering.

SUMMARY OF THE INVENTION

A thin film transistor array panel according to an embodiment of the present invention includes: a gate electrode; a semiconductor layer; a gate insulating layer disposed between the gate electrode and the semiconductor layer; a source electrode connected to the semiconductor layer; and a drain electrode connected to the semiconductor layer, spaced apart from the source electrode, and including two branches overlapping the gate electrode, wherein the two branches of the drain electrode are spaced apart from each other and lie on a straight line or on two parallel straight lines.

The gate electrode may have two opposite edges meeting the two branches, respectively, and substantially parallel to each other.

The thin film transistor array panel may further include: a gate line coupled to the gate electrode; a data line coupled to the drain electrode; and a pixel electrode coupled to the drain electrode.

The two branches may have a symmetry with respect to a center line passing through the gate electrode and parallel to the gate line or the data line.

The source electrode may enclose the two branches.

The source electrode may have a symmetry with respect to the center line passing through the gate electrode and parallel to the gate line or the data line.

The source electrode may be spaced apart from the gate line except for the source electrode.

The source electrode may have a shape of a character H or a shape of a character H rotated by about a right angle.

The pixel electrode may include a lower half and an upper half that are disposed opposite each other with respect to the gate line.

The drain electrode may have a symmetry with respect to a center line of the gate line.

The thin film transistor array panel may further include a storage electrode line overlapping at least one of the pixel electrode and the drain electrode.

The storage electrode may be disposed near an edge of the pixel electrode.

The storage electrode may be disposed near an edge of the pixel electrode.

A thin film transistor according to another embodiment includes: a gate electrode having a first edge and a second edge disposed opposite the first edge; a semiconductor layer; a gate insulating layer disposed between the gate electrode and the semiconductor layer; a source electrode connected to the semiconductor layer; a drain electrode connected to the semiconductor layer, spaced apart from the source electrode, and including a first branch and a second branch, wherein the first branch meets the first edge of the gate electrode at a predetermined angle, the second branch meets the second edge of the gate electrode at the predetermined angle.

The first edge of the gate electrode may be substantially parallel to the second edge of the gate electrode.

A thin film transistor array panel according to another embodiment includes: a gate line including a gate electrode; a data line intersecting the gate line and including a source electrode; a drain electrode disposed apart from the source electrode and including two branches; a semiconductor layer connected to the source electrode and the drain electrode; a passivation layer formed on the gate line, the data line, the drain electrode, and the semiconductor layer; and a pixel electrode connected to the drain electrode, wherein the source electrode includes two concave portions connected to each other and disposed opposite each other and the two concave portions enclose respective branches of the drain electrode.

The source electrode may include a connecting portion connected between the concave portions and the data line and the connecting portion may be spaced apart from the gate line.

BRIEF DESCRIPTION OF THE DRAWINGS

The present invention will become more apparent by describing embodiments thereof in detail with reference to the accompanying drawing in which.

DETAILED DESCRIPTION OF PREFERRED EMBODIMENTS

Figure 1:
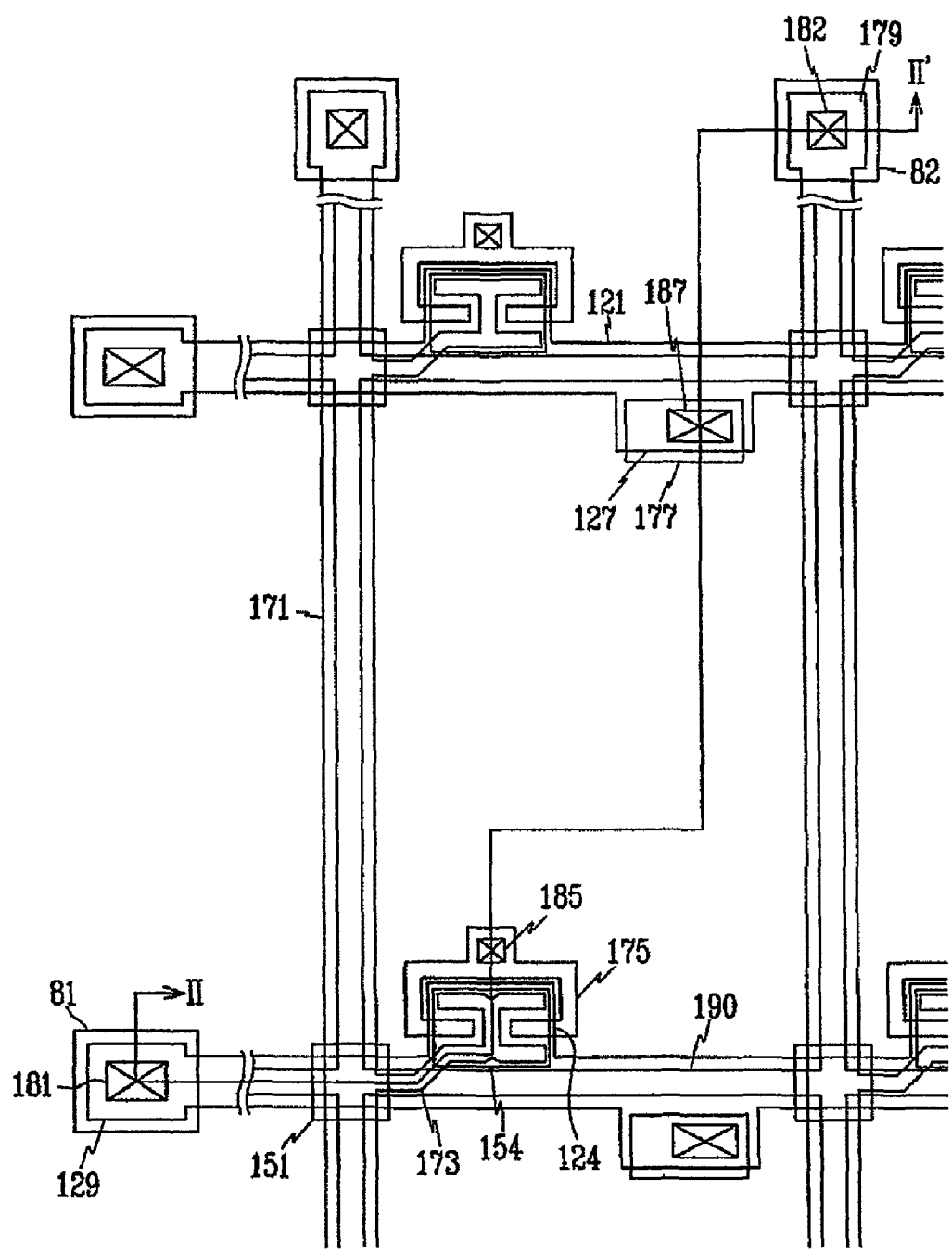
FIG. 1 shows a layout view of a TFT array panel according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

A TFT array panel according to an embodiment of the present invention will be described in detail with reference to FIGS. 1 and 2.

Figure 2:
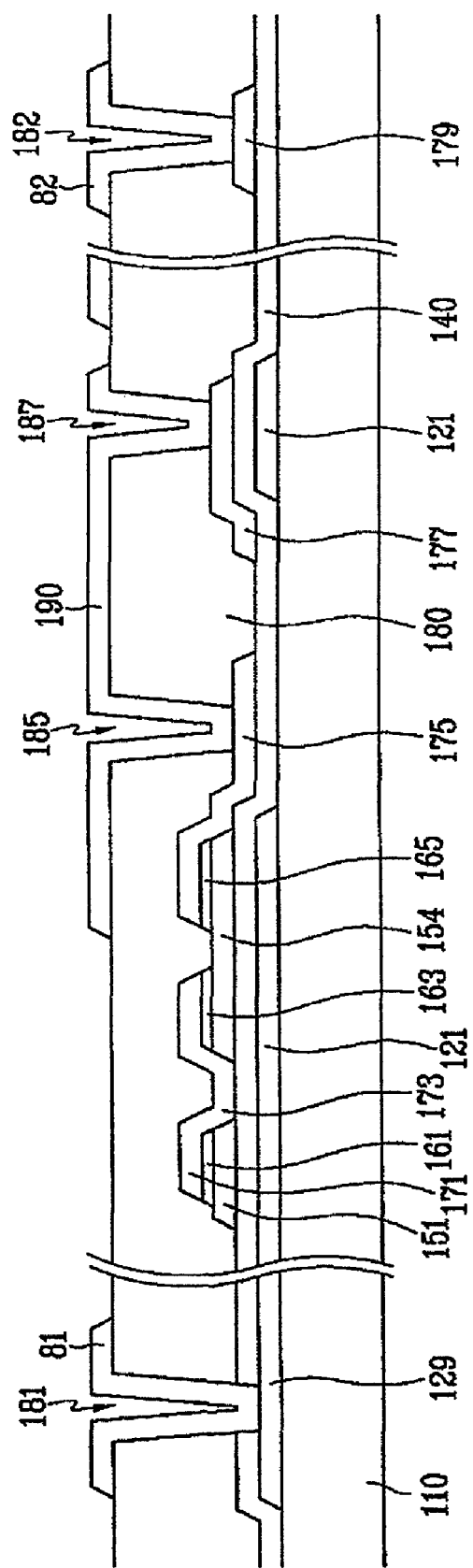
FIG. 2 shows a sectional view of the TFT array panel shown in FIG. 1 taken along the line II-II'.

FIG. 1 shows a layout view of a TFT array panel according to an embodiment of the present invention, and FIG. 2 shows a sectional view of the TFT array panel shown in FIG. 1 taken along the line II-II'.

A plurality of gate lines 121 is formed on an insulating substrate 110 such as transparent glass or plastic.

The gate lines 121 transmit gate signals and extend substantially in a transverse direction. Each of the gate lines 121 includes a plurality of gate electrodes 124 projecting upwardly, a plurality of gate line projections 127 projecting downwardly, and a gate line end portion 129 having a large area for contact with another layer (not shown) or an external driving circuit (not shown). A gate driving circuit (not shown) for generating gate signals may be mounted on a flexible printed circuit (FPC) film (not shown), which may be attached to the insulating substrate 110, directly mounted on the insulating substrate 110, or integrated onto the insulating substrate 110. The gate lines 121 may extend to be connected to a driving circuit (not shown) that may be integrated on the insulating substrate 110.

The gate lines 121 are preferably made of Al containing metal such as Al and Al alloy, Ag containing metal such as Ag and Ag alloy, Cu containing metal such as Cu and Cu alloy, Mo containing metal such as Mo and Mo alloy, Cr, Ta, or Ti. However, they may have a multi-layered structure including two conductive films (not shown) having different physical characteristics. One of the two films is preferably made of low resistivity metal including Al containing metal, Ag containing metal, and Cu containing metal for reducing signal delay or voltage drop. The other film is preferably made of material such as Mo containing metal, Cr, Ta, or Ti, which has good physical, chemical, and electrical contact characteristics with other materials such as indium tin oxide (ITO) or indium zinc oxide (IZO). Good examples of the combination of the two films are a lower Cr film and an upper Al (alloy) film and a lower Al (alloy) film and an upper Mo (alloy) film. However, the gate lines 121 may be made of other metals or conductors.

Lateral sides of the gate lines 121 are inclined relative to a surface of the insulating substrate 110, and the inclination angle thereof ranges about 30-80 degrees.

A gate insulating layer 140 preferably made of silicon nitride (SiNx) or silicon oxide (SiOx) is formed on the gate lines 121.

A plurality of first and second semiconductor islands 151 and 154 preferably made of hydrogenated amorphous silicon (abbreviated to "A-Si") or polysilicon is formed on the gate insulating layer 140. The second semiconductor islands 154 are disposed on the gate electrodes 124 such that edges of the second semiconductor islands 154 are disposed on the gate electrodes 124 to block a light emitted from a backlight lamp from being incident onto the second semiconductor islands 154, thereby reducing a photocurrent. The first semiconductor islands 151 are disposed on the gate lines 121 and cover lower and upper edges of the gate lines 121.

A plurality of second and third ohmic contact islands 163 and 165 are formed on the second semiconductor islands 154. A plurality of first ohmic contacts 161 are also formed on the first semiconductor islands 151. The first, second and third ohmic contacts 161, 163 and 165 are preferably made of n+ hydrogenated A-Si heavily doped with n type impurity such as phosphorous or they may be made of silicide.

The lateral sides of the first and second semiconductor islands 151 and 154 and the first, second and third ohmic contacts 161, 163 and 165 are inclined relative to the surface of the insulating substrate 110, and the inclination angles thereof are preferably in a range of about 30-80 degrees.

A plurality of data lines 171, a plurality of drain electrodes 175, and a plurality of storage capacitor conductors 177 are formed on the first, second and third ohmic contacts 161, 163 and 165 and the gate insulating layer 140.

The data lines 171 transmit data signals and extend substantially in a longitudinal direction to intersect the gate lines 121. Each data line 171 includes a plurality of source electrodes 173 projecting toward the gate electrodes 124 and having a bilateral symmetry on the gate electrodes 124. Each of the source electrodes 173 includes a longitudinal portion and two pairs of transverse portions extending from both ends of the longitudinal portion in left and right directions having a shape like a character "H" rotated about 90 degrees. Each of the data lines 171 further includes a data line end portion 179 having a large area for contact with another layer (not shown) or an external driving circuit (not shown). A data driving circuit (not shown) for generating the data signals may be mounted on a FPC film (not shown), which may be attached to the insulating substrate 110, directly mounted on the insulating substrate 110, or integrated onto the insulating substrate 110. The data lines 171 may extend to be connected to a driving circuit (not shown) that may be integrated on the insulating substrate 110.

The drain electrodes 175 are separated from the data lines 171 and disposed opposite the source electrodes 173 with respect to the gate electrodes 124. Each of the drain electrodes 175 includes a wide portion and two branches. The two branches lie on a straight line or on two parallel straight lines and are spaced apart from each other. The branches form a hook portion having a bilateral symmetry. The hook portion has a shape like a character "C" and is disposed partly enclosing a gate electrode 124, and end portions of the hook portion pass through opposite longitudinal edges to reach inner portions of the gate electrode 124. Both ends of the hook portion are disposed on a gate electrode 124 and partly enclosed by a source electrode 173.

The symmetrical arrangement of the drain electrodes 175 with respect to the gate electrodes 124 causes a uniform overlapping area between the drain electrodes 175 and the gate electrodes 124 regardless of deformation of masks such as transition, rotation, and twist. Although masks for forming the gate electrodes 124 and the drain electrodes 175 are shifted, rotated, or twisted to misalign the gate electrodes 124 and the drain electrodes 175 in a transverse direction such that one of left and right overlapping areas between the gate electrodes 124 and the drain electrodes 175 is decreased, the other of the left and right overlapping areas is increased to compensate from the decrease of the one overlapping area. Accordingly, the parasitic capacitances between the gate electrodes 124 and the drain electrodes 175 can be maintained uniformly to reduce the flickering of the image. In addition, the longitudinal misalignment between the gate electrodes 124 and the drain electrodes 175 does not affect the overlapping area between the gate electrodes 124 and the drain electrodes 175.

The storage capacitor conductors 177 overlap the gate line projections 127.

A gate electrode 124, a source electrode 173, and a drain electrode 175 along with a projection of a second semiconductor island 154 form a TFT having a channel formed in the second semiconductor island 154 disposed between the source electrode 173 and the drain electrode 175.

The data lines 171, the drain electrodes 175, and the storage capacitor conductors 177 are preferably made of a refractory metal such as Cr, Mo, Ta, Ti, or alloys thereof. However, they may have a multilayered structure including a refractory metal film (not shown) and a low resistivity film (not shown). Examples of the multi-layered structure are a double-layered structure including a lower Cr/Mo (alloy) film and an upper Al (alloy) film and a triple-layered structure of a lower Mo (alloy) film, an intermediate Al (alloy) film, and an upper Mo (alloy) film. However, the data lines 171, the drain electrodes 175, and the storage capacitor conductors 177 may be made of other metals or conductors.

The data lines 171, the drain electrodes 175, and the storage capacitor conductors 177 have inclined edge profiles, and the inclination angles thereof range about 30-80 degrees.

The first, second and third ohmic contacts 161, 163 and 165 are interposed only between the underlying first and second semiconductor islands 151 and 154 and the overlying data lines 171 and drain electrodes 175 thereon and reduce the contact resistance therebetween. The first semiconductor islands 151 smooth the profile of the surface, thereby preventing the disconnection of the data lines 171. The first and second semiconductor islands 151 and 154 include some exposed portions, which are not covered with the data lines 171, the drain electrodes 175, or the storage capacitor conductors 177, such as portions located between the source electrodes 173 and the drain electrodes 175.

A passivation layer 180 is formed on the data lines 171, the drain electrodes 175, the storage capacitor electrodes 177, and the exposed portions of the first and second semiconductor islands 151 and 154. The passivation layer 180 is preferably made of an inorganic or organic insulator and it may have a flat top surface. Examples of the inorganic insulator include silicon nitride and silicon oxide. The organic insulator may have photosensitivity and a dielectric constant of less than about 4.0. The passivation layer 180 may include a lower film of an inorganic insulator and an upper film of an organic insulator such that it takes the excellent insulating characteristics of the organic insulator while preventing the exposed portions of the first and second semiconductor islands 151 and 154 from being damaged by the organic insulator.

The passivation layer 180 has a plurality of second, third and fourth contact holes 182, 185 and 187 exposing the data line end portions 179, the drain electrodes 175, and the gate line projections 127, respectively. The passivation layer 180 and the gate insulating layer 140 have a plurality of first contact holes 181 exposing the gate line end portions 129.

A plurality of pixel electrodes 190 and a plurality of first and second contact assistants 81 and 82 are formed on the passivation layer 180. They are preferably made of transparent conductor such as ITO or IZO or reflective conductor such as Ag, Al, Cr, or alloys thereof.

The pixel electrodes 190 are physically and electrically connected to the drain electrodes 175 through the third contact holes 185 such that the pixel electrodes 190 receive data voltages from the drain electrodes 175. The pixel electrodes 190 supplied with the data voltages generate electric fields in cooperation with a common electrode (not shown) of an opposing display panel (not shown) supplied with a common voltage, which determine the orientations of liquid crystal (LC) molecules (not shown) of an LC layer (not shown) disposed between the pixel electrodes 190 and the common electrode. A pixel electrode 190 and the common electrode form a capacitor referred to as a "liquid crystal capacitor," which stores applied voltages after the TFT turns off.

In addition, the pixel electrodes 190 are connected to the storage capacitor conductors 177 overlapping the gate line projections 127. A pixel electrode 190 and a storage capacitor conductor 177 connected thereto and a gate line projection 127 form an additional capacitor referred to as a "storage capacitor," which enhances the voltage storing capacity of the liquid crystal capacitor.

A TFT array panel for an LCD according to another embodiment of the present invention will be described in detail with reference to FIGS. 3, 4 and 5.

Figure 3:
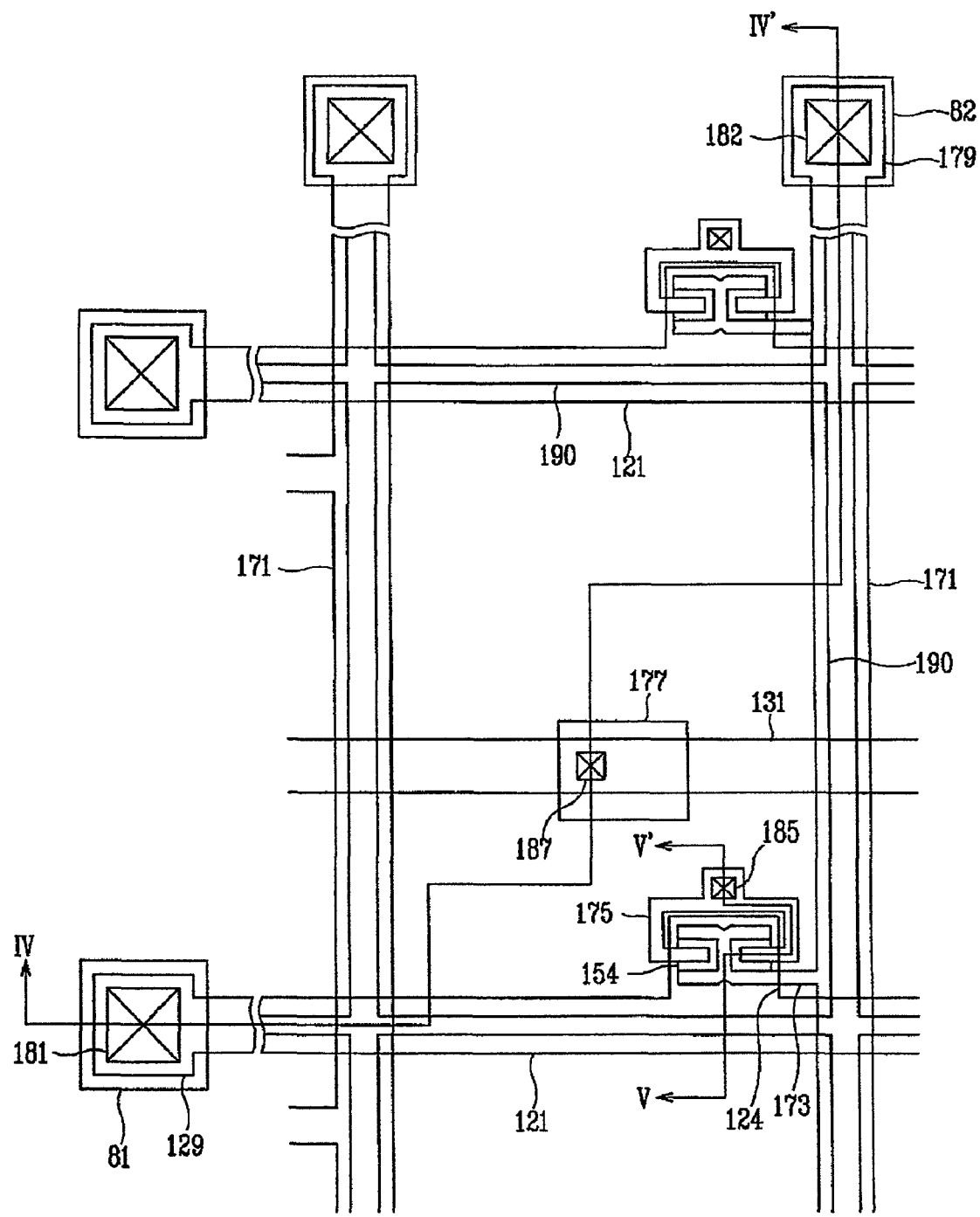
FIG. 3 shows a layout view of a TFT array panel for an LCD according to another embodiment of the present invention.
Figure 4:
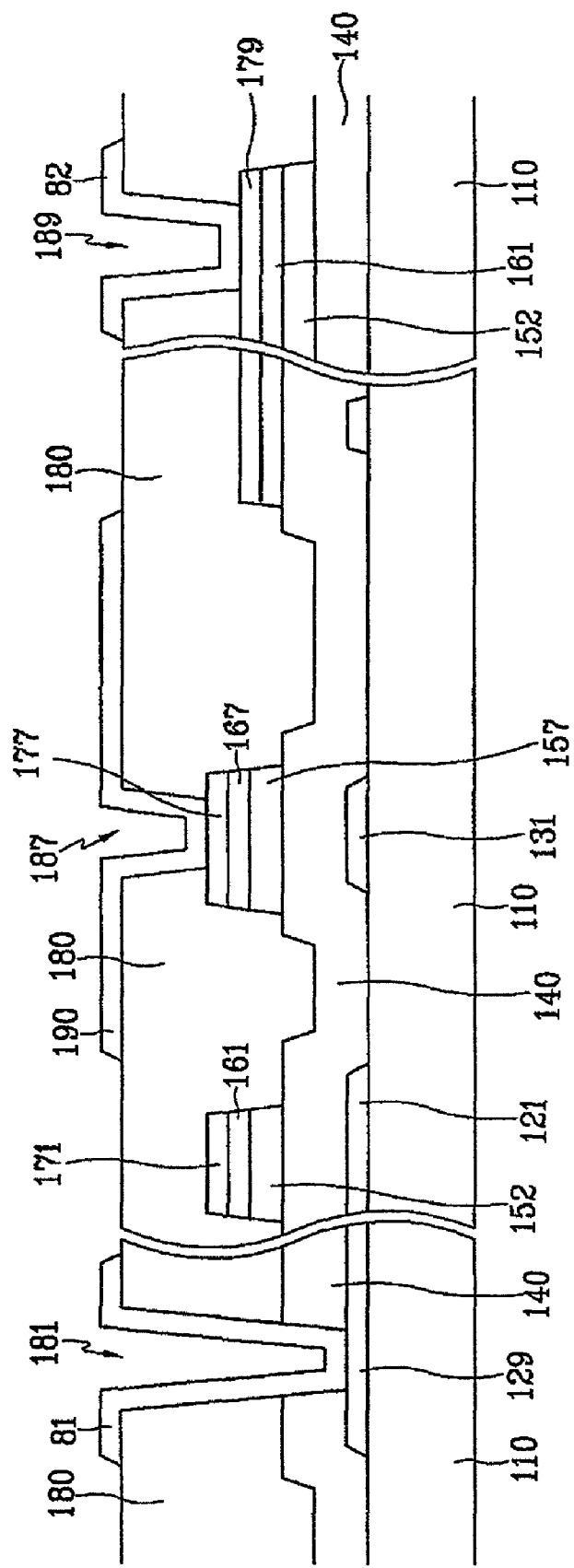
FIG. 4 shows a sectional view of the TFT array panel shown in FIG. 3 taken along the line IV-IV'.
Figure 5:
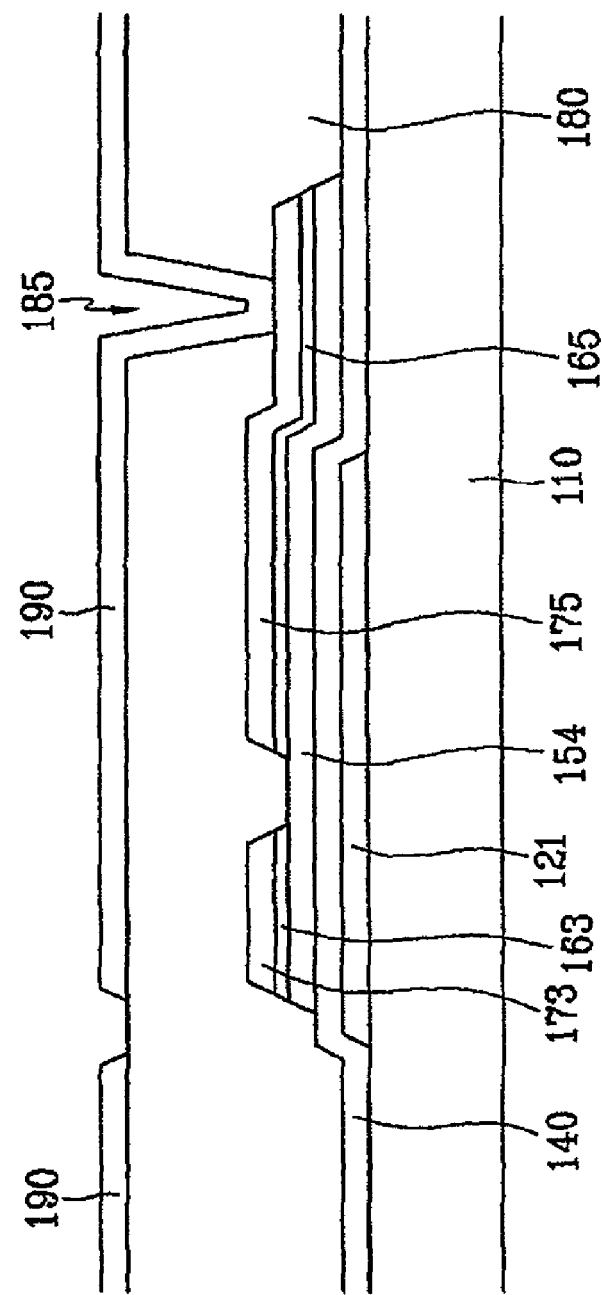
FIG. 5 shows a sectional view of the TFT array panel shown in FIG. 3 taken along the line V-V'.

FIG. 3 shows a layout view of a TFT array panel for an LCD according to another embodiment of the present invention, FIG. 4 shows a sectional view of the TFT array panel shown in FIG. 3 taken along the line IV-IV', and FIG. 5 shows a sectional view of the TFT array panel shown in FIG. 3 taken along the line V-V'.

Referring to FIGS. 3-5, the layered structure of the TFT array panel according to this embodiment is similar to those shown in FIGS. 1 and 2.

That is, a plurality of gate lines 121 including gate electrodes 124 are formed on an insulating substrate 110, and a gate insulating layer 140, a plurality of semiconductor stripes 152 including a plurality of semiconductor stripe projections 153, and a plurality of ohmic contacts 161 including ohmic contact projections 163 and a plurality of ohmic contact islands 165 are sequentially formed thereon. A plurality of data lines 171 including source electrodes 173, a plurality of drain electrodes 175, and a plurality of storage capacitor conductors 177 are formed on the ohmic contact stripes and islands 161 and 165, and a passivation layer 180 is formed thereon. A plurality of first, second, third and fourth contact holes 181, 182, 185 and 187 are provided at the passivation layer 180 and the gate insulating layer 140. A plurality of pixel electrodes 190 and a plurality of first and second contact assistants 81 and 82 are formed on the passivation layer 180.

In this embodiment, the source electrodes 173 are spaced apart from the gate lines 121.

Furthermore, the TFT array panel according to this embodiment provides a plurality of storage electrode lines 131, which are separated from the gate lines 121, on the same layer as the gate lines 121 without gate line projections. The storage electrode lines 131 are supplied with a predetermined voltage such as the common voltage and extend substantially parallel to the gate lines 121. Each of the storage electrode lines 131 is disposed between two adjacent gate lines 121 and it is nearly equidistant from the two adjacent gate lines 121. The storage electrode lines 131 overlap the storage capacitor conductors 177 to form storage capacitors.

However, the storage electrode lines 131 may have various shapes and arrangements. For example, the storage electrode lines 131 may be omitted if the storage capacitance generated by the overlap of the gate lines 121 and the pixel electrodes 190 is sufficient. The storage electrode lines 131 may be disposed near the gate lines 121 to increase the aperture ratio.

In addition, the semiconductor stripes 152 of the TFT array panel 100 according to this embodiment have similar planar shapes as the data lines 171 and the drain electrodes 175 as well as the underlying ohmic contact stripes and islands 161 and 165. However, the semiconductor stripe projections 153 include some exposed portions, which are not covered with the data lines 171 or the drain electrodes 175, such as portions located between the source electrodes 173 and the drain electrodes 175.

Furthermore, the TFT array panel 100 further includes a plurality of fifth semiconductor islands 157 and a plurality of fifth ohmic contact islands 167 disposed under the storage capacitor conductors 177.

A manufacturing method of the TFT array panel according to an embodiment simultaneously forms the data lines 171, the drain electrodes 175, the semiconductors 151, and the ohmic contact stripes and islands 161 and 165 using one photolithography process.

A photoresist pattern for the photolithography process has position-dependent thickness, and in particular, it has first and second portions with decreasing thickness. The first portions are located on wire areas that will be occupied by the data lines 171 and the drain electrodes 175, and the second portions are located on channel areas of the TFTs.

The position-dependent thickness of the photoresist is obtained by several techniques, for example, by providing translucent areas on the exposure mask as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. Once a photoresist pattern made of a reflowable material is formed by using a normal exposure mask only with transparent areas and opaque areas, it is subject to reflow process to flow onto areas without the photoresist, thereby forming thin portions.

As a result, the manufacturing process is simplified by omitting a photolithography step.

Many of the above-described features of the TFT array panel for an LCD shown in FIGS. 1 and 2 may be applicable to the TFT array panel shown in FIGS. 3-5.

An LCD according to another embodiment of the present invention will be described in detail with reference to FIGS. 6, 7, 8 and 9.

Figure 6:
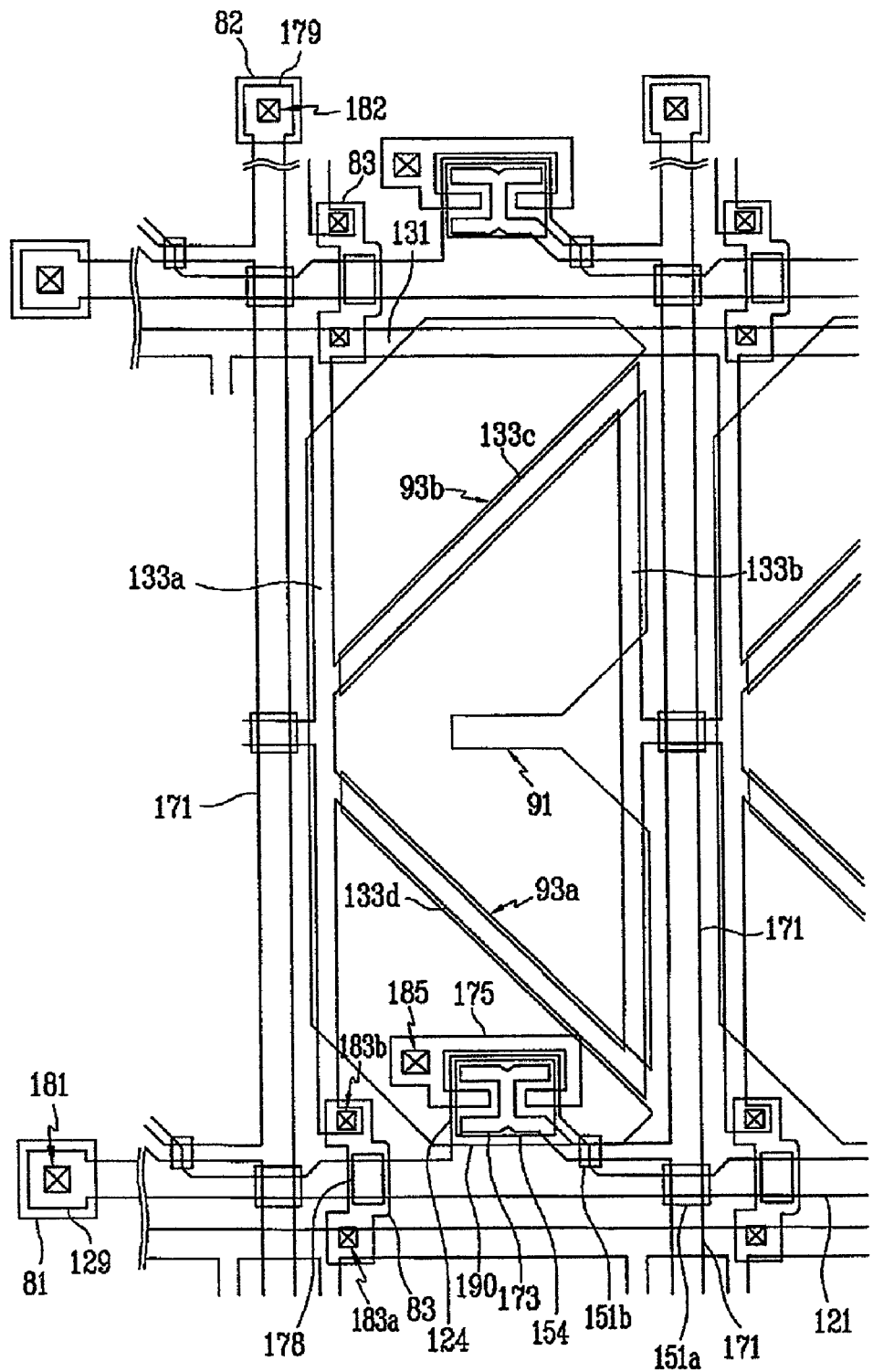
FIG. 6 shows a layout view of a TFT array panel for an LCD according to another embodiment of the present invention.
Figure 7:
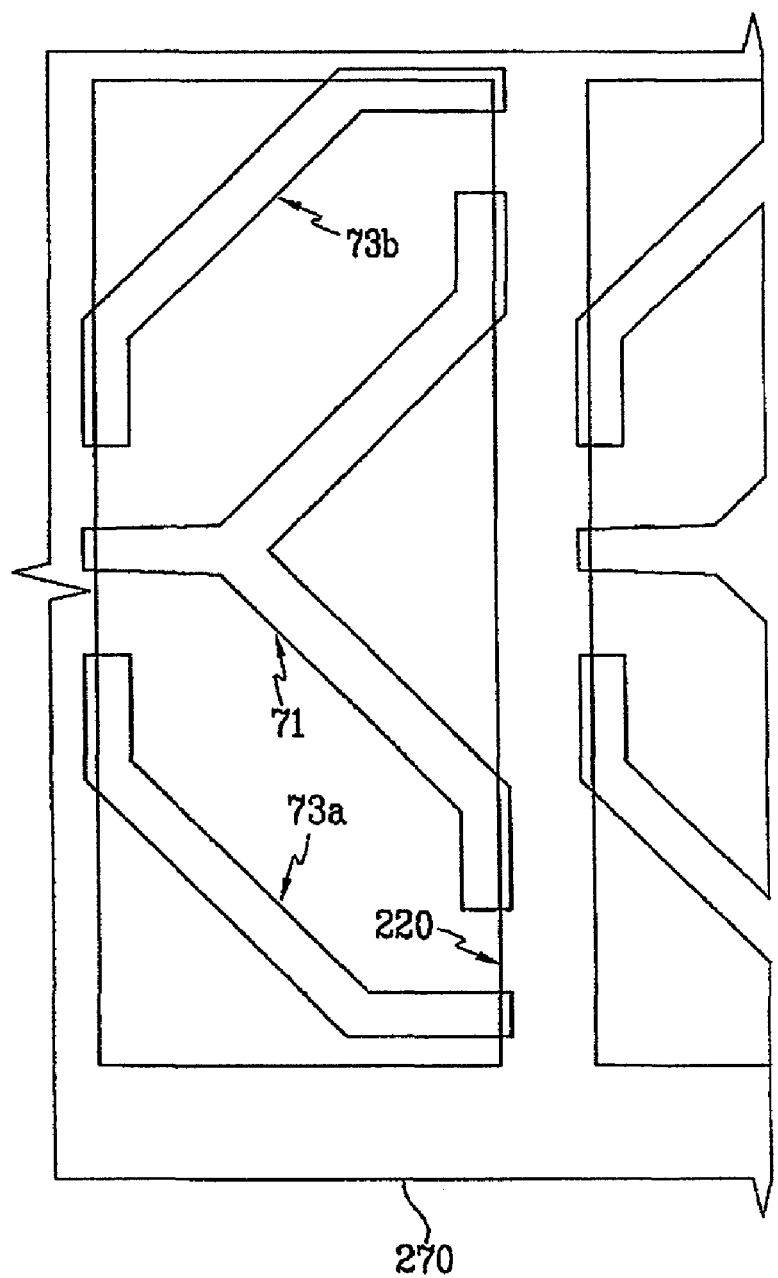
FIG. 7 shows a layout view of a common electrode panel for an LCD according to an embodiment of the present invention.
Figure 8:
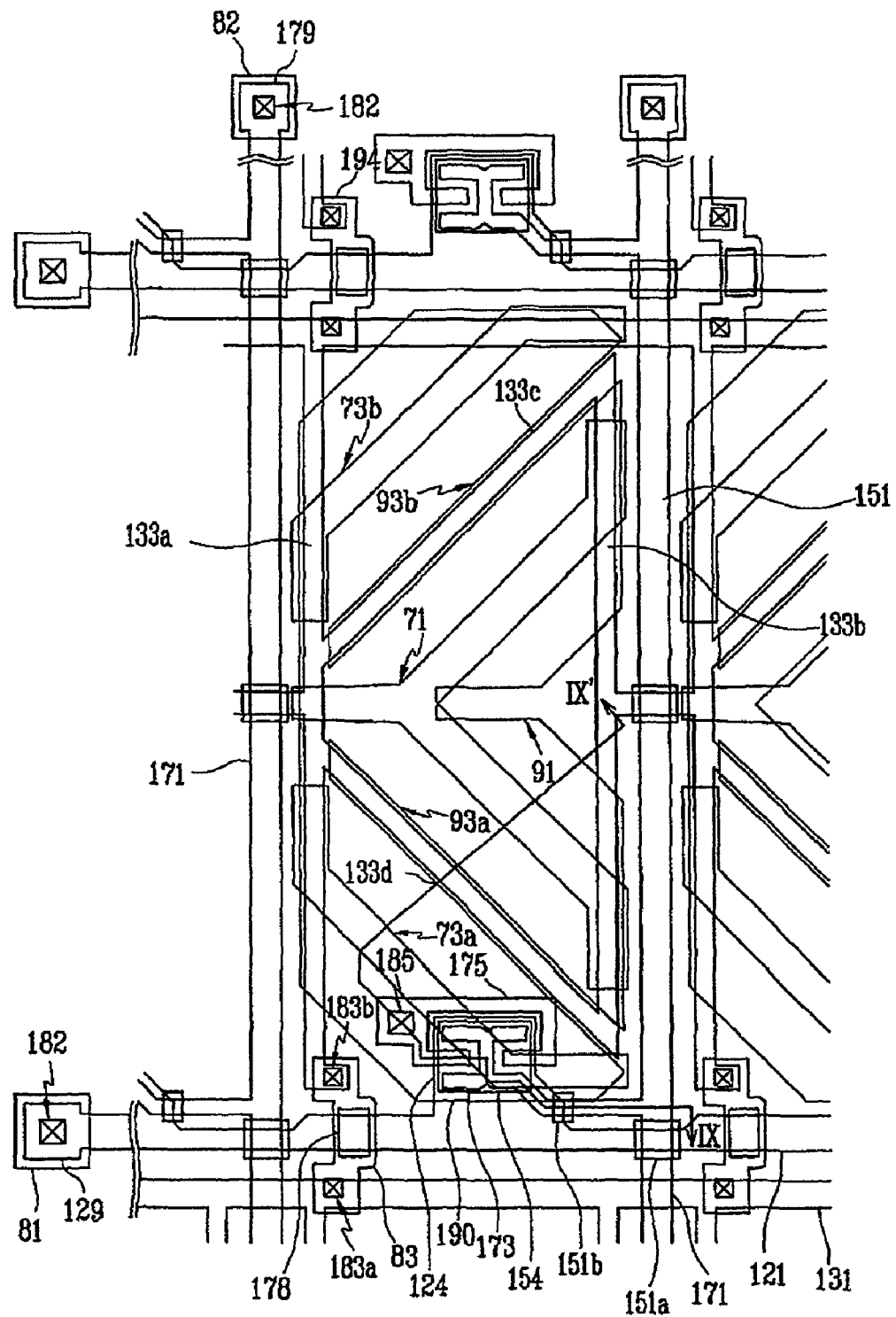
FIG. 8 shows a sectional view of an LCD including the TFT array panel shown in FIG. 6 and the common electrode panel shown in FIG. 7.
Figure 9:
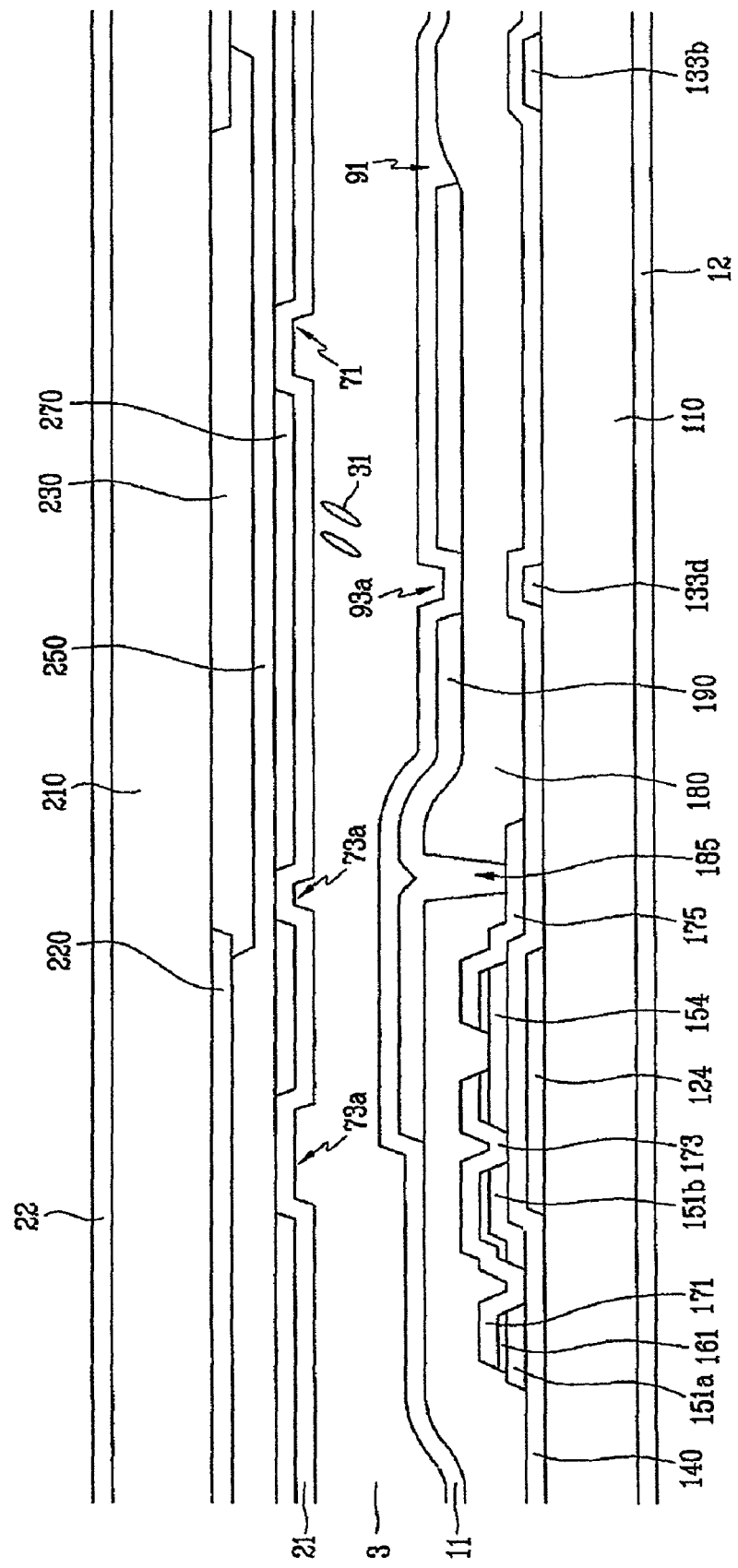
FIG. 9 shows a sectional view of the LCD shown in FIG. 8 taken along the line IX-IX'.

FIG. 6 shows a layout view of a TFT array panel for an LCD according to another embodiment of the present invention, FIG. 7 shows a layout view of a common electrode panel for an LCD according to an embodiment of the present invention, FIG. 8 shows a sectional view of an LCD including the TFT array panel shown in FIG. 6 and the common electrode panel shown in FIG. 7, and FIG. 9 shows a sectional view of the LCD shown in FIG. 8 taken along the line IX-IX'.

Referring to FIGS. 6-9, an LCD according to this embodiment also includes a TFT array panel 100, a common electrode panel 200, a liquid crystal (LC) layer 3 interposed between the TFT array and common electrode panels 100 and 200, and a pair of polarizers 12 and 22 attached on outer surfaces of the TFT array and common electrode panels 100 and 200.

The layered structure of the TFT array panel 100 according to this embodiment is similar to those shown in FIGS. 1 and 2.

A plurality of gate lines 121 including gate electrodes 124 and gate line end portions 129 are formed on an insulating substrate 110, and a gate insulating layer 140, a plurality of third, fourth and second semiconductor islands 151a, 151b and 154, and a plurality of ohmic contact islands 161a, 161b, 163 and 165 are sequentially formed thereon. A plurality of data lines 171 including source electrodes 173 and data line end portions 179 and a plurality of drain electrodes 175 are formed on the ohmic contact islands 161a, 161b, 163 and 165 and the gate insulating layer 140, and a passivation layer 180 is formed thereon. A plurality of first, second and third contact holes 181, 182 and 185 are provided at the passivation layer 180 and the gate insulating layer 140. A plurality of pixel electrodes 190 and a plurality of first and second contact assistants 81 and 82 are formed on the passivation layer 180.

The TFT array panel according to this embodiment provides a plurality of storage electrode lines 131, which are separated from the gate lines 121, on the same layer as the gate lines 121 without gate line projections. The storage electrode lines 131 are supplied with a predetermined voltage and each of the storage electrode lines 131 includes a stem extending substantially parallel to the gate lines 121, a plurality of first, second, third and fourth storage electrodes 133a, 133b, 133c and 133d branched from the stem, and a plurality of storage connections 133e. Each of the storage electrode lines 131 is disposed between two adjacent gate lines 121 and the stem is close to an upper one of the two adjacent gate lines 121.

The first and the second storage electrodes 133a and 133b extend in a longitudinal direction and face each other. The first storage electrodes 133a have a fixed end portion connected to the stem and a free end portion disposed opposite the fixed end portion and having a projection. The third and the four storage electrodes 133c and 133d obliquely extend approximately from a center of the first storage electrodes 133a and upper and lower ends of the second storage electrodes 133b, respectively. Each of the storage connections 133e is connected between adjacent first through fourth storage electrodes 133a-133d. However, the storage electrode lines 131 may have various shapes and arrangements.

A pixel electrode 190 overlaps a storage electrode line 131 including first through fourth storage electrodes 133a-133d. Each pixel electrode 190 is shaped approximately like a rectangle that having lower and upper transverse main edges nearly parallel to the gate lines 121, left and right longitudinal main edges nearly parallel to the data lines 171 and chamfered corners. The chamfered corners of the pixel electrode 190 make an angle of about 45 degrees with the gate lines 121. The left and right longitudinal main edges of the pixel electrode 190 are disposed closer to a data line 171 than the first and second storage electrodes 133a and 133b. The pixel electrode 190 with a drain electrode 175 connected thereto, and the storage electrode line 131 including the first through fourth storage electrodes 133a-133d form a storage capacitor.

The source electrodes 173 are spaced apart from the gate lines 121 and the ohmic contacts 161b are disposed between edges of the gate electrodes 124 and the source electrodes 173. The third semiconductor islands 151a and the ohmic contacts 161a are disposed between the gate lines 121 and the data lines 171.

A plurality of isolated metal pieces 178 are formed on the gate insulating layer 140, the passivation layer 180 and the gate insulating layer 140 that has a plurality of fixed end contact holes 183a exposing portions of the storage electrode lines 131 near fixed end portions of the first storage electrodes 133a, and a plurality of free end contact holes 183b exposing free end portions of the first storage electrodes 133a, and a plurality of overpasses 83 are formed on the passivation layer 180.

The isolated metal pieces 178 disposed on the gate lines 121 near the first storage electrodes 133a, and the overpasses 83 are disposed on the isolated metal pieces 178. The overpasses 83 cross over the gate lines 121 and are connected to exposed portions of the storage electrode lines 131 and exposed free end portions of the first storage electrodes 133a through the fixed end and free end contact holes 183a and 183b, respectively, which are disposed opposite each other with respect to the gate lines 121. The storage electrode lines 131 along with the overpasses 83 can be used for repairing defects in the gate lines 121, the data lines 171, or TFTs.

Each pixel electrode 190 has a first center cutout 91, a first lower cutout 93a, and a first upper cutout 93b, which partition the pixel electrode 190 into a plurality of partitions. The first center, first lower and first upper pixel electrode cutouts 91, 93a and 93b substantially have an inversion symmetry with respect to an imaginary transverse line bisecting the pixel electrode 190.

The first lower and first upper pixel electrode cutouts 93a and 93b obliquely extend from the right longitudinal main edge of the pixel electrode 190 near right angles approximately to a center of the left longitudinal main edge of the pixel electrode 190 and overlap the third and the fourth storage electrodes 133c and 133d, respectively. The first lower and first upper pixel electrode cutouts 93a and 93b are disposed at lower and upper halves of the pixel electrode 190, respectively, which can be divided by the imaginary transverse line. The first lower and first upper pixel electrode cutouts 93a and 93b make an angle of about 45 degrees to the gate lines 121, and extend substantially perpendicularly to each other.

The first center pixel electrode cutout 91 extends along the imaginary transverse line and has an inlet from the right main edge of the pixel electrode 190, which has a pair of inclined edges substantially parallel to the first lower cutout 93a and the first upper cutout 93b, respectively.

Accordingly, the lower half of the pixel electrode 190 is partitioned into two lower partitions by the first lower pixel electrode cutout 93a and the upper half of the pixel electrode 190 is also partitioned into two upper partitions by the first upper pixel electrode cutout 93b. The number of partitions or the number of pixel electrode cutouts varies depending on the design factors such as the size of the pixels, the ratio of the transverse main edges to the longitudinal main edges of the pixel electrode 190, and the type and characteristics of the LC layer 3.

The description of the common electrode panel 200 follows with reference to FIGS. 7-9.

A light blocking member 220 referred to as a black matrix for preventing light leakage is formed on an insulating substrate 210 such as transparent glass or plastic. The light blocking member 220 has a plurality of openings 225 that face the pixel electrodes 190 and it may have a substantially similar planar shape to the pixel electrodes 190. Otherwise, the light blocking member 220 may include a plurality of rectilinear portions facing the data lines 171 on the TFT array panel 100 and a plurality of widened portions facing the TFTs on the TFT array panel 100.

A plurality of color filters 230 is formed on the insulating substrate 210 and is disposed substantially in the area enclosed by the light blocking member 220. The color filters 230 may extend substantially in a longitudinal direction along the pixel electrodes 190. The color filters 230 may represent one of the primary colors such as red, green or blue.

An overcoat 250 is formed on the color filters 230 and the light blocking member 220. The overcoat 250 is preferably made of an organic insulator. It prevents the color filters 230 from being exposed and provides a flat surface. The overcoat 250 may be omitted.

A common electrode 270 is formed on the overcoat 250. The common electrode 270 is preferably made of transparent conductive material such as ITO and IZO.

The common electrode 270 faces a pixel electrode 190 and includes a first center cutout 71, a first lower cutout 73a, and a first upper cutout 73b. Each of the first center, first lower and first upper common electrode cutouts 71, 73a and 73b is disposed between adjacent first center, first lower and first upper pixel electrode cutouts 91, 93a and 93b or between a first lower or first upper pixel electrode cutout 93a or 93b and a chamfered corner of the pixel electrode 190. Each of the first center, first lower and first upper common electrode cutouts 71, 73a and 73b has at least an oblique portion extending substantially parallel to the first lower pixel electrode cutout 93a or the first upper pixel electrode cutout 93b. The first center, first lower and first upper common electrode cutouts 71, 73a and 73b have substantially an inversion symmetry with respect to the above-described imaginary transverse line bisecting the pixel electrode 190.

Each of the first lower and first upper common electrode cutouts 73a and 73b includes an oblique portion, a transverse portion, and a longitudinal portion. The oblique portion extends approximately from the left longitudinal main edge of the pixel electrode 190 approximately to the lower or upper transverse main edge of the pixel electrode 190. Each of the transverse and longitudinal portions extend from a respective end of the oblique portion along an edge of the pixel electrode 190, overlapping the edge of the pixel electrode 190, and making an obtuse angle with the oblique portion.

The first center common electrode cutout 71 includes a central transverse portion, a pair of oblique portions, and a pair of terminal longitudinal portions. The central transverse portion extends approximately from the left longitudinal main edge of the pixel electrode 190 along the above-described transverse line. The oblique portions extend from an end of the central transverse portion approximately to the right longitudinal main edge of the pixel electrode 190 and make oblique angles with the central transverse portion. The terminal longitudinal portions extend from the ends of the respective oblique portions along the right longitudinal main edge of the pixel electrode 190, overlapping the right longitudinal main edge of the pixel electrode 190, and making obtuse angles with the respective oblique portions.

The number of the first center, first lower and first upper common electrode cutouts 71, 73a and 73b may vary depending on the design factors, and the light blocking member 220 may also overlap the first center, first lower and first upper common electrode cutouts 71, 73a and 73b to block the light leakage through the first center, first lower and first upper common electrode cutouts 71, 73a and 73b.

First and second alignment layers 11 and 21 that may be homeotropic are coated on inner surfaces of the TFT array and common electrode panels 100 and 200.

The pair of polarizers 12 and 22 are provided on outer surfaces of the TFT array and common electrode panels 100 and 200 so that their polarization axes may be crossed and one of the polarization axes may be parallel to the gate lines 121. When the angle between the polarization axes and the cutouts 71-72b and 91-92b is about 45 degrees, the efficiency of the light is very high. When the polarization axes is substantially parallel to edges of the TFT array and common electrode panels 100 and 200, i.e., parallel to the gate lines 121 and the data lines 171, the cost for the pair of polarizers 12 and 22 is small. One of the pair of polarizers 12 and 22 may be omitted when the LCD is a reflective LCD.

The LCD may further include at least one retardation film (not shown) for compensating the retardation of the LC layer 3. The LCD may further include a backlight unit (not shown) supplying light to the LC layer 3 through the pair of polarizers 12 and 22, the retardation film, and the TFT array and common electrode panels 100 and 200.

It is preferable that the LC layer 3 has negative dielectric anisotropy and it is subjected to a vertical alignment that LC molecules 31 in the LC layer 3 are aligned such that their long axes are substantially vertical to the surfaces of the TFT array and common electrode panels 100 and 200 in the absence of an electric field. Accordingly, incident light cannot pass the crossed polarization system composed of the pair of polarizers 12 and 22.

Upon application of the common voltage to the common electrode 270 and a data voltage to a pixel electrode 190, an electric field substantially perpendicular to the surfaces of the TFT array and common electrode panels 100 and 200 is generated. Both the pixel electrode 191 and the common electrode 270 are commonly referred to as "field generating electrodes." The LC molecules 31 tend to change their orientations in response to the electric field such that their long axes are perpendicular to the field direction.

The first center, first lower and first upper pixel electrode cutouts 91, 93a and 93b and the first center, first lower and first upper common electrode cutouts 71, 73a and 73b and the edges of the pixel electrodes 190 distort the electric field to have a horizontal component that is substantially perpendicular to the edges of the first center, first lower and first upper pixel electrode cutouts 91, 93a and 93b and the first center, first lower and first upper common electrode cutouts 71, 73a and 73b and the edges of the pixel electrodes 190.

Referring to FIG. 8, the first center, first lower and first upper common electrode cutouts 71, 73a and 73b and the first center, first lower and first upper pixel electrode cutouts 91, 93a and 93b divides a pixel electrode 190 into a plurality of sub-areas and each sub-area has two primary edges making oblique angles with the main edges of the pixel electrode 190. Since most LC molecules 31 on each sub-area tilt perpendicular to the primary edges, the azimuthal distribution of the tilt directions are localized to four directions, thereby increasing the reference viewing angle of the LCD. The width of the sub-area is preferably from about 12 microns to about 20 microns, and more preferably from about 17 microns to about 19 microns.

The width of the first center, first lower and first upper common electrode cutouts 71, 73a and 73b and the first center, first lower and first upper pixel electrode cutouts 91, 93a and 93b is preferably equal to from about 9 microns to about 12 microns, and the shapes and the arrangements of the first center, first lower and first upper common electrode cutouts 71, 73a and 73b and the first center, first lower and first upper pixel electrode cutouts 91, 93a and 93b may be modified.

At least one of the first center, first lower and first upper common electrode cutouts 71, 73a and 73b and the first center, first lower and first upper pixel electrode cutouts 91, 93a and 93b can be substituted with protrusions (not shown) or depressions (not shown) preferably having a width of from about 5 microns to about 10 microns. The protrusions are preferably made of organic or inorganic material and disposed on or under the pixel electrode 190 or the common electrode 270.

Many of the above-described features of the TFT array panel for an LCD shown in FIGS. 1 and 2 may be applicable to the TFT array panel shown in FIGS. 6-9.

An LCD according to another embodiment of the present invention will be described in detail with reference to FIGS. 10, 11, 12 and 13.

Figure 10:
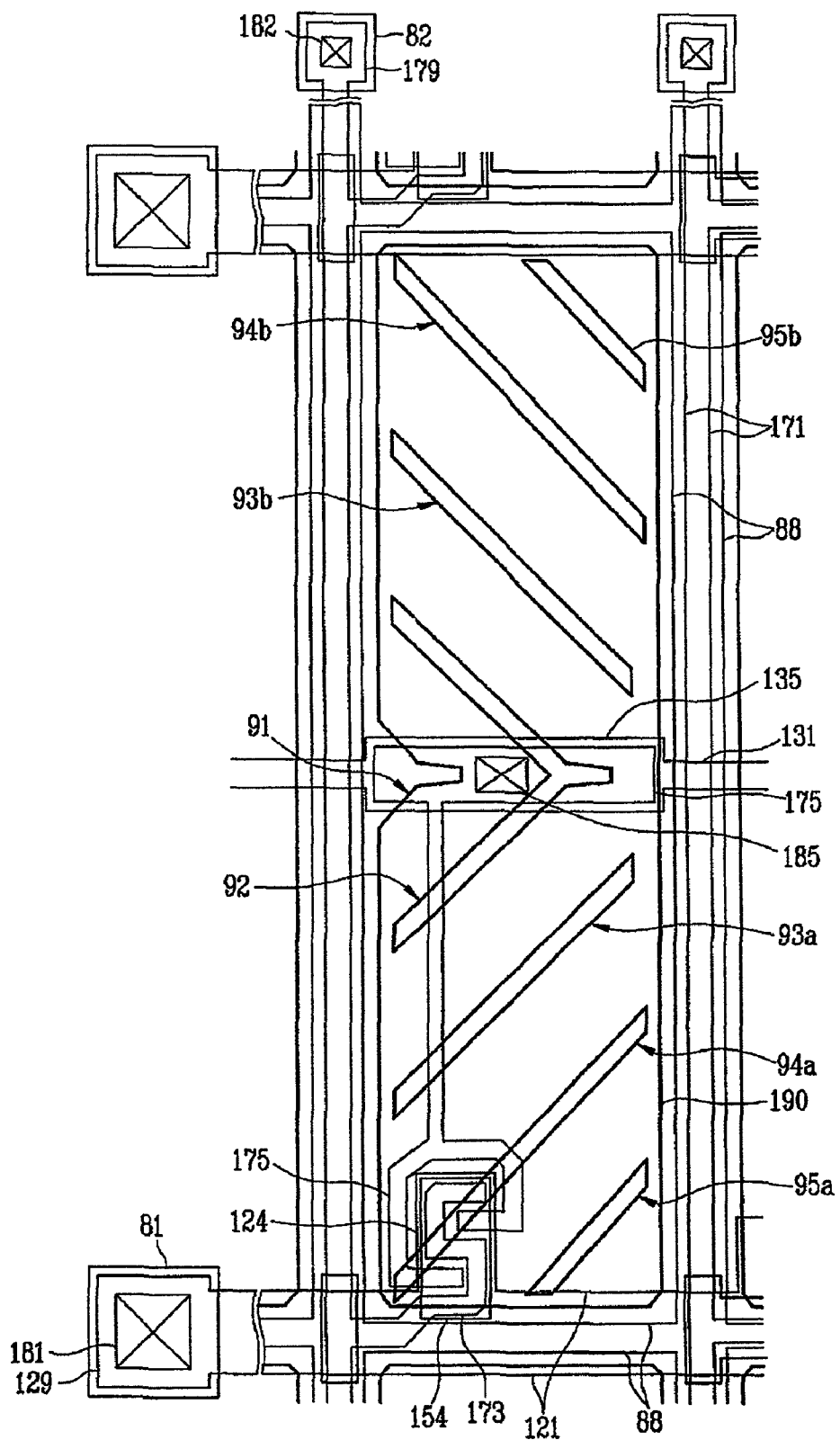
FIG. 10 shows a layout view of a TFT array panel for an LCD according to another embodiment of the present invention.
Figure 11:
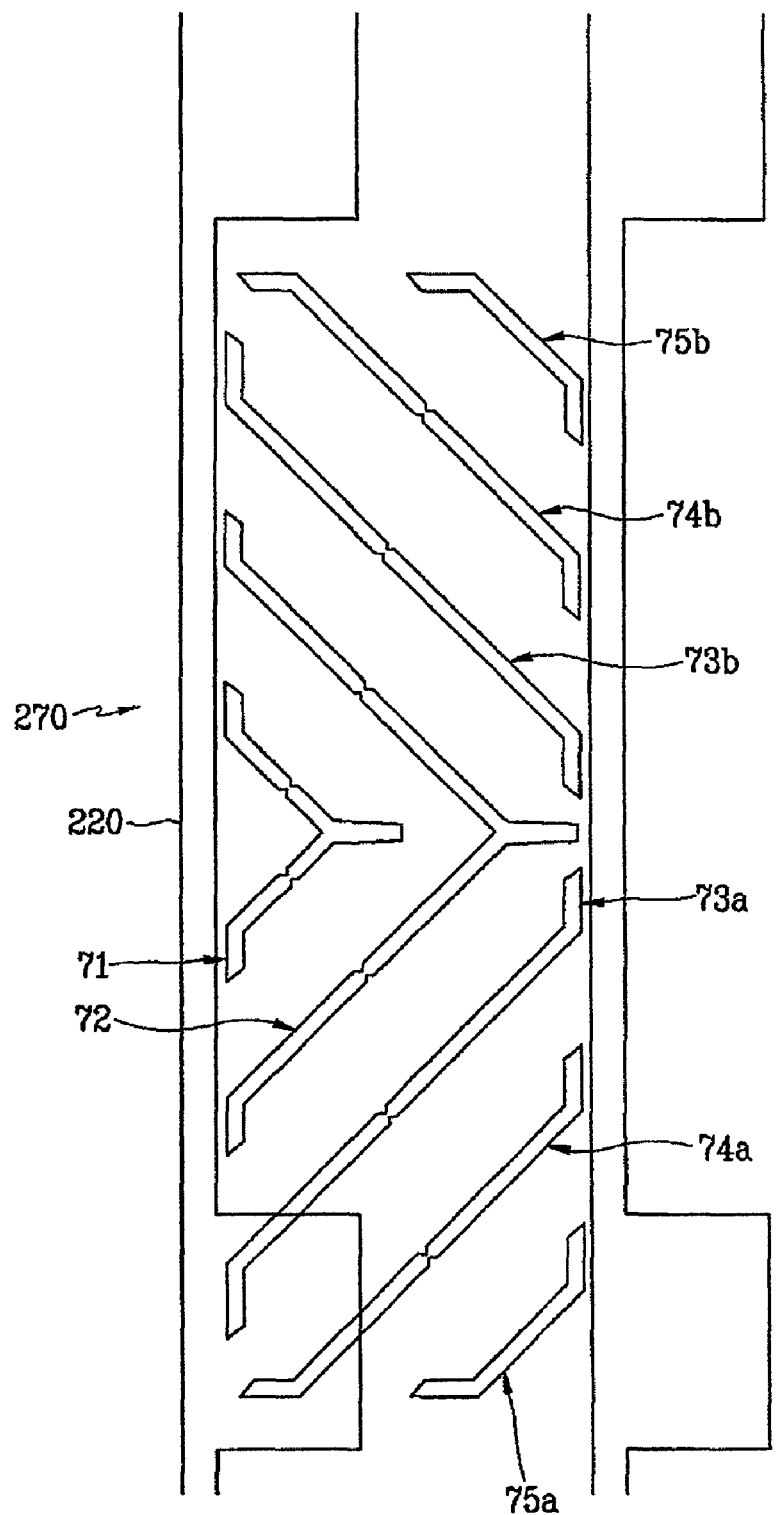
FIG. 11 shows a layout view of a common electrode panel for an LCD according to another embodiment of the present invention.
Figure 12:
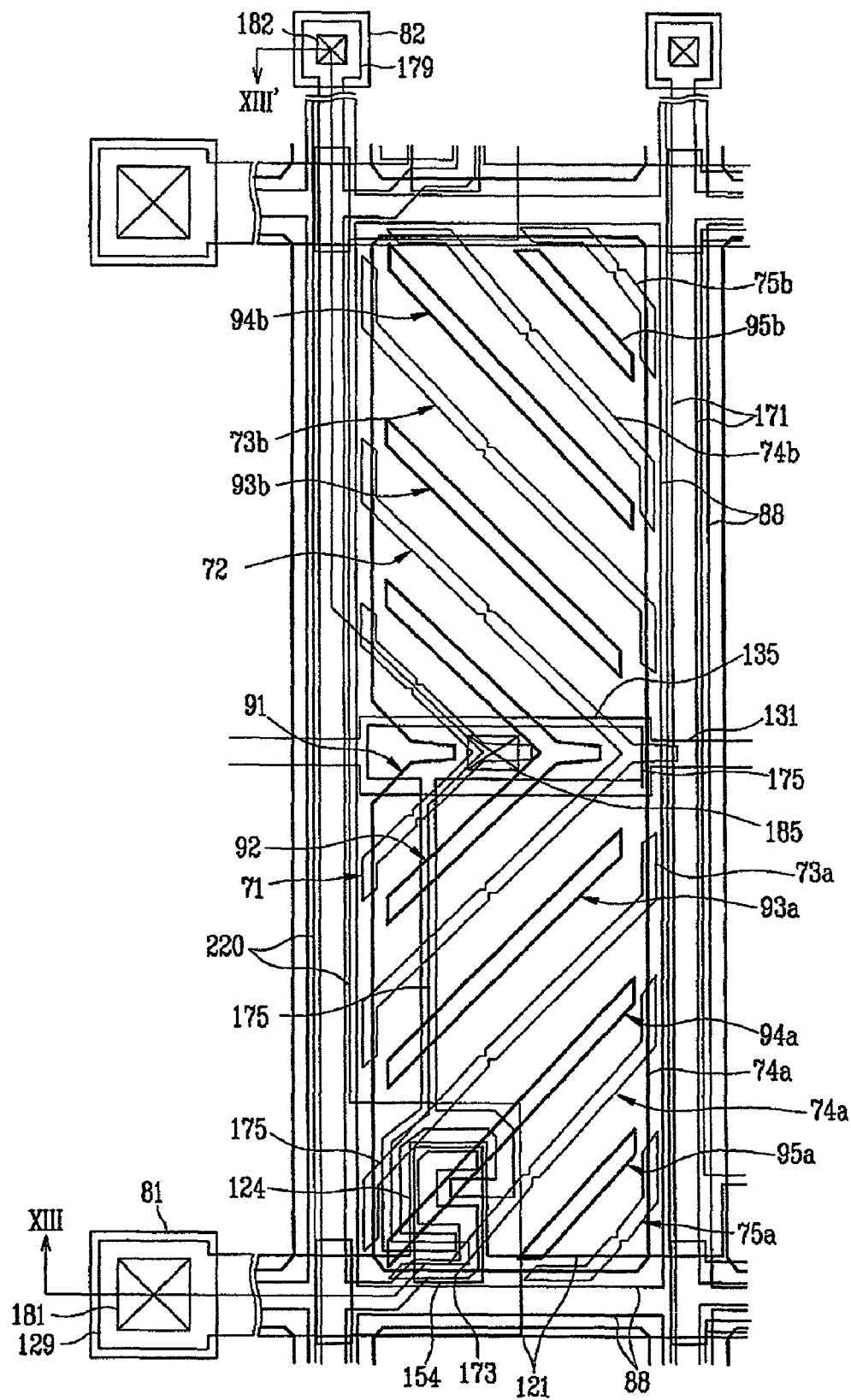
FIG. 12 shows a sectional view of an LCD including the TFT array panel shown in FIG. 10 and the common electrode panel shown in FIG. 11.
Figure 13:
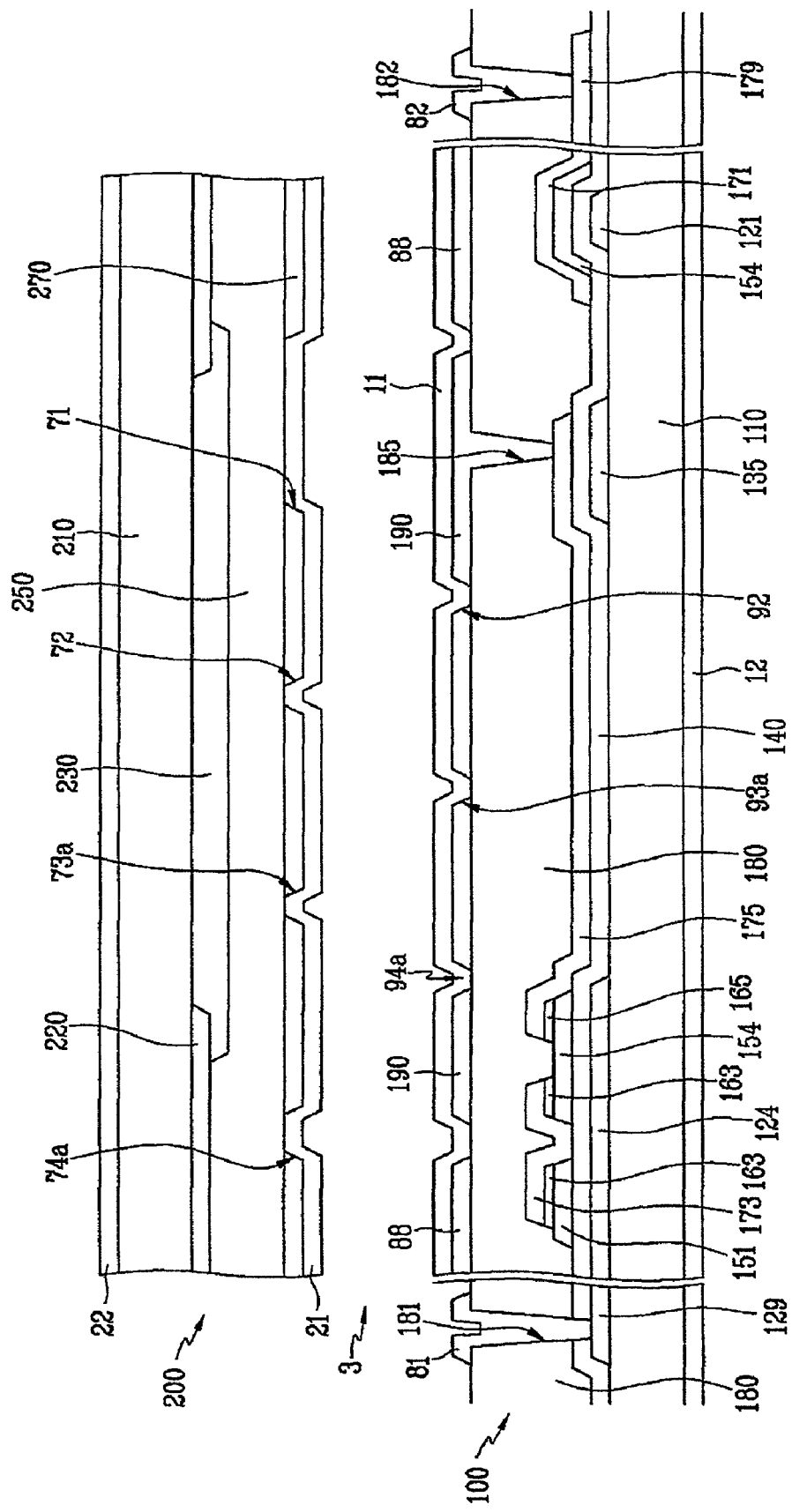
FIG. 13 shows a sectional view of the LCD shown in FIG. 12 taken along the line XIII-XIII'.

FIG. 10 shows a layout view of a TFT array panel for an LCD according to another embodiment of the present invention, FIG. 11 shows a layout view of a common electrode panel for an LCD according to another embodiment of the present invention, FIG. 12 shows a sectional view of an LCD including the TFT array panel shown in FIG. 10 and the common electrode panel shown in FIG. 11, and FIG. 13 shows a sectional view of the LCD shown in FIG. 12 taken along the line XIII-XIII'.

Referring to FIGS. 10-13, an LCD according to this embodiment also includes a TFT array panel 100, a common electrode panel 200, an LC layer 3 interposed between the TFT array and common electrode panels 100 and 200, and a pair of polarizers 12 and 22 attached on outer surfaces of the TFT array and common electrode panels 100 and 200.

Layered structures of the TFT array and common electrode panels 100 and 200 according to this embodiment are similar to those shown in FIGS. 6-9.

Regarding the TFT array panel 100, a plurality of gate lines 121 including gate electrodes 124 and gate line end portions 129 and a plurality of storage electrode lines 131 are formed on an insulating substrate 110. A gate insulating layer 140, a plurality of first and second semiconductor islands 151 and 154, and a plurality of ohmic contacts 161, 163 and 165 are formed on the gate lines 121 and the storage electrode lines 131. A plurality of data lines 171 including source electrodes 173 and data line end portions 179 and a plurality of drain electrodes 175 are formed on the ohmic contacts 163 and 165 and the gate insulating layer 140, and a passivation layer 180 is formed thereon. A plurality of first, second and third contact holes 181, 182 and 185 are provided at the passivation layer 180 and the gate insulating layer 140. A plurality of pixel electrodes 190 including first and second center and first through third lower and upper pixel electrode cutouts 91-95b and a plurality of first and second contact assistants 81 and 82 are formed on the passivation layer 180, and a first alignment layer 11 is coated thereon.

Regarding the common electrode panel 200, a light blocking member 220, a plurality of color filters 230, an overcoat 250, a common electrode 270 including first and second center and first through third lower and upper common electrode cutouts 71-75b, and a second alignment layer 21 are formed on an insulating substrate 210.

In this embodiment, each of the storage electrode lines 131 is nearly equidistant from two adjacent gate lines 121 and includes a plurality of fifth storage electrodes 135 expanding upward and downward. However, the storage electrode lines 131 may have various shapes and arrangements.

Each of the drain electrodes 175 includes a wide end portion and two branches. The wide end portion overlaps a fifth storage electrode 135 and edges of the wide end portion are substantially parallel to edges of the fifth storage electrodes 135. The branches form a hook portion enclosing the gate electrode 124 and the branches are disposed on two parallel straight lines. A source electrode 173 encloses end portions of the branches and has a shape like a character "S."

This structure, having a rotational symmetry, also keeps the overlapping areas between the gate electrodes 124 and the drain electrodes 175 uniform to maintain the parasitic capacitances between the gate electrodes 124 and the drain electrodes 175 to be consistent.

The TFT array panel 100 according to this embodiment further includes a shielding electrode 88 disposed on the passivation layer 180. The shielding electrode 88 is supplied with the common voltage and it includes longitudinal portions extending along the data lines 171 and transverse portions extending along the gate lines 121. The longitudinal portions fully cover the data lines 171, and the transverse portions connect adjacent longitudinal portions and lie within the boundary of the gate lines 121. The shielding electrode 88 blocks electric fields generated between the data lines 171 and the pixel electrodes 190 and between the data lines 171 and the common electrode 270 to reduce the distortion of the voltage of the pixel electrode 190 and the signal delay of the data voltages transmitted by the data lines 171. Since there is no electric field between the shielding electrode 88 and the common electrode 270, LC molecules (not shown) on the shielding electrode 88 remain in their initial orientations and thus the light incident thereon is blocked. Accordingly, the shielding electrode 88 may serve as a light blocking member.

Each of the center, first through third lower and first through third upper pixel electrode cutouts 71-74b has at least one depressed notch at its oblique portion(s). The depressed notch(es) determine(s) the tilt directions of the LC molecules on the center, first through third lower and first through third upper common electrode cutouts 71-74b and they may be provided at the center, first through forth lower and first through fourth upper pixel electrode cutouts 91-95b.

Many of the above-described features of the TFT array panel for an LCD shown in FIGS. 6-9 may be applicable to the TFT array panel shown in FIGS. 10-13.

An LCD according to another embodiment of the present invention will be described in detail with reference to FIGS. 14 and 15.

Figure 14:
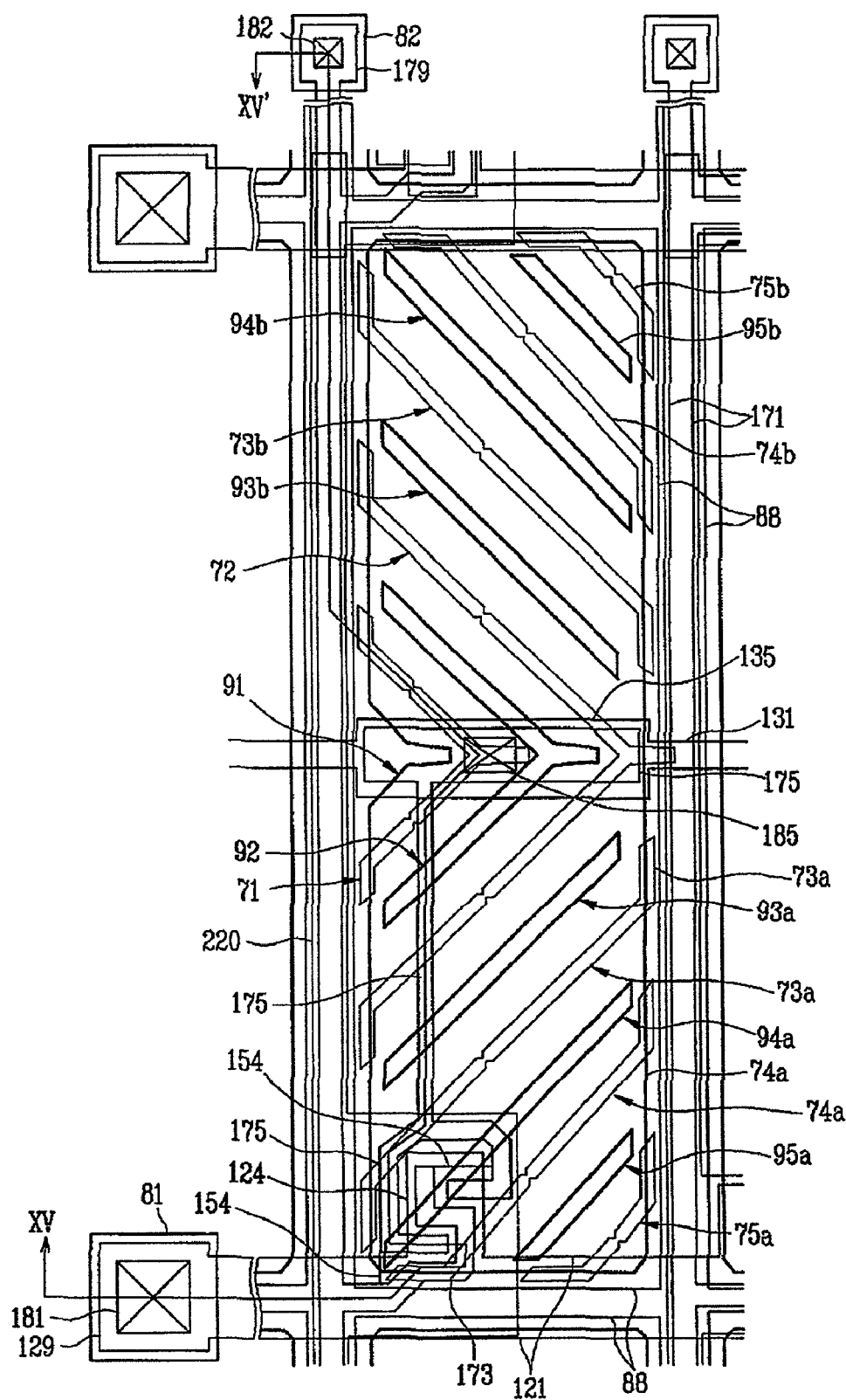
FIG. 14 shows a layout view of an LCD according to another embodiment of the present invention.
Figure 15:
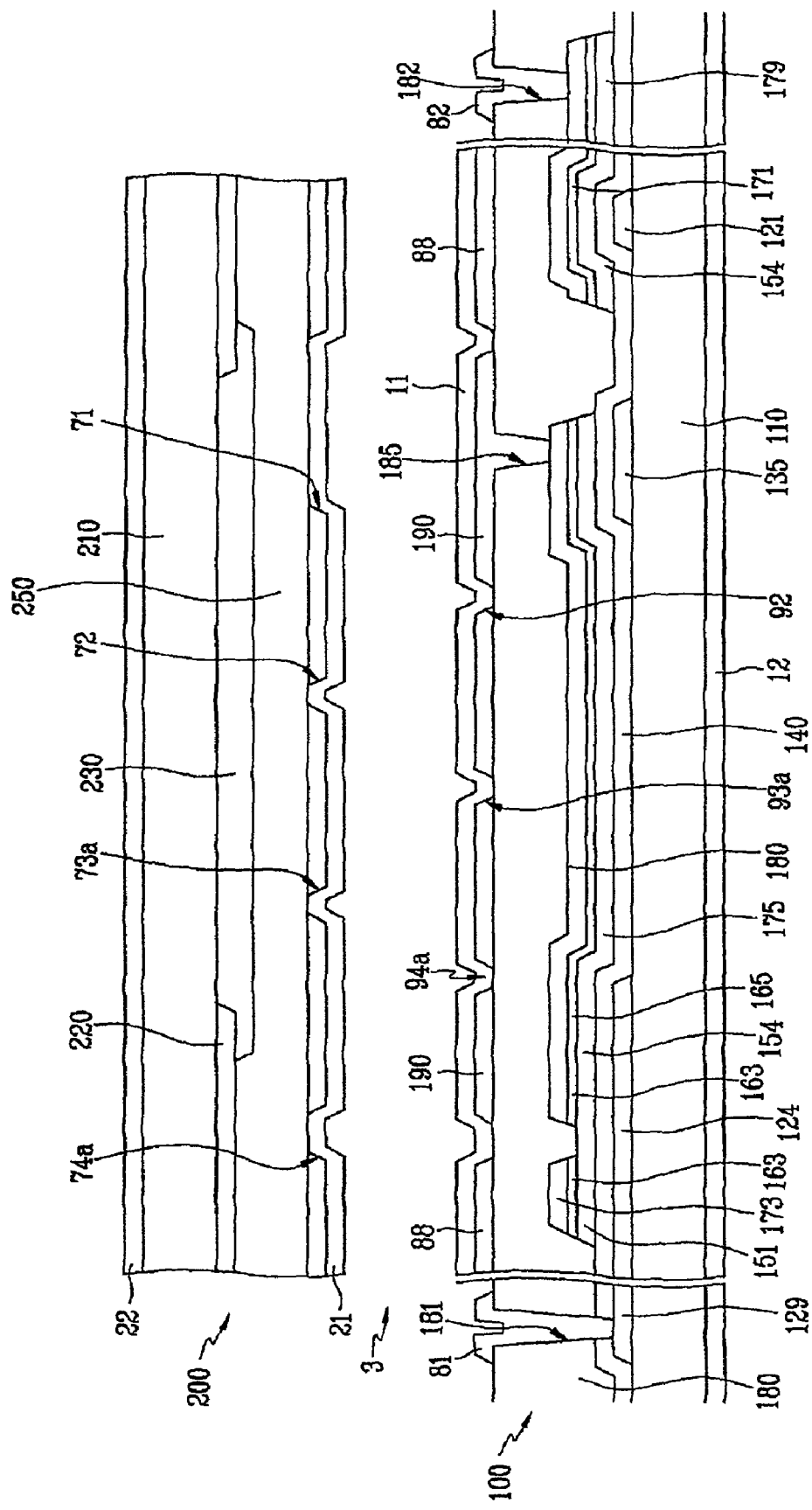
FIG. 15 shows a sectional view of the LCD shown in FIG. 12 taken along the line XV-XV'.

FIG. 14 shows a layout view of an LCD according to another embodiment of the present invention, and FIG. 15 shows a sectional view of the LCD shown in FIG. 12 taken along the line XV-XV'.

Referring to FIGS. 14 and 15, an LCD according to this embodiment also includes a TFT array panel 100, a common electrode panel 200, an LC layer 3 interposed between the TFT array and common electrode panels 100 and 200, and a pair of polarizers 12 and 22 attached on outer surfaces of the TFT array and common electrode panels 100 and 200.

Layered structures of the TFT array and common electrode panels 100 and 200 according to this embodiment are similar to those shown in FIGS. 10-13.

Regarding the TFT array panel 100, a plurality of gate lines 121 including gate electrodes 124 and gate line end portions 129 and a plurality of storage electrode lines 131 including sixth storage electrodes 137 are formed on an insulating substrate 110. A gate insulating layer 140, a plurality of semiconductor stripes 152 including a plurality of semiconductor stripe projections 153, and a plurality of ohmic contact stripes 161 including ohmic contact stripe projections 163 and a plurality of ohmic contact islands 165 are sequentially formed on the gate lines 121 and the storage electrode lines 131. A plurality of data lines 171 including source electrodes 173 and data line end portions 179 and a plurality of drain electrodes 175 are formed on the ohmic contacts 163 and 165, and a passivation layer 180 is formed thereon. A plurality of first, second and third contact holes 181, 182 and 185 are provided at the passivation layer 180 and the gate insulating layer 140. A plurality of pixel electrodes 190 including first and second center and first through third lower and upper pixel electrode cutouts 91-95b and a plurality of first and second contact assistants 81 and 82 are formed on the passivation layer 180, and a first alignment layer 11 is coated thereon.

Regarding the common electrode panel 200, a light blocking member 220, a plurality of color filters 230, an overcoat 250, a common electrode 270 including first and second center and first through third lower and upper common electrode cutouts 71-75b, and a second alignment layer 21 are formed on an insulating substrate 210.

In this embodiment, each of the source electrodes 173 has a shape like a scoop disposed over a gate electrode 124.

In addition, the semiconductor stripes 152 of the TFT array panel 100 according to this embodiment have similar planar shapes as the data lines 171 and the drain electrodes 175 as well as the underlying ohmic contacts 161 and 165. However, the semiconductor stripe projections 153 of the semiconductor stripes 152 include some exposed portions, which are not covered with the data lines 171 or the drain electrodes 175, such as portions located between the source electrodes 173 and the drain electrodes 175.

As described above, the pixel electrodes and the contact holes connecting the drain electrodes and the pixel electrodes are formed using one lithography step. Accordingly, a lithography step for forming the pixel electrodes is omitted to simplify the manufacturing method, thereby reducing the manufacturing time and cost.

An LCD according to another embodiment of the present invention will be described in detail with reference to FIG. 16.

Figure 16:
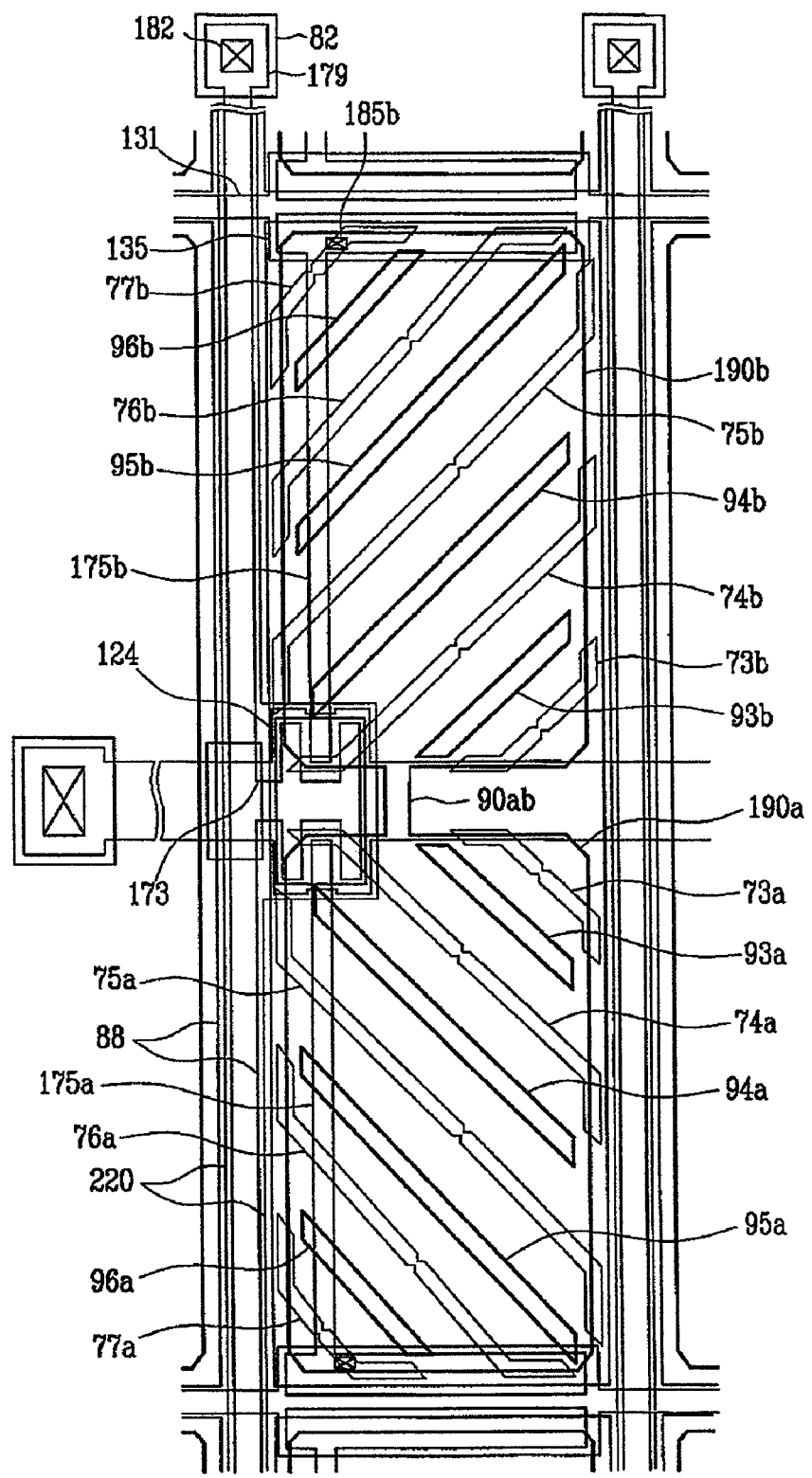
FIG. 16 shows a layout view of an LCD according to another embodiment of the present invention.

FIG. 16 is a layout view of an LCD according to another embodiment of the present invention.

Referring to FIG. 16, the layout structure of an LCD according to this embodiment is similar to that shown in FIGS. 10-13.

In this embodiment, a pixel electrode 190 is divided into a lower pixel electrode portion 190a and an upper pixel electrode portion 190*b* connected to each other through a pixel electrode connection 90*ab*. The lower and upper pixel electrode portions 190*a* and 190*b* have first through forth lower and upper pixel electrode cutouts 93*a*-96*b* that have symmetry with respect to a center transverse line of the pixel electrode 190.

A common electrode 270 has first through fifth lower and upper common electrode cutouts 73*a*-77*b* disposed between the first through forth lower and upper pixel electrode cutouts 93*a*-96*b* and the chamfered corners of the pixel electrode 190.

Individual gate lines 121 are disposed between the lower pixel electrode portions 190*a* and the upper pixel electrode portions 190*b*, and include a plurality of gate electrodes 124 projecting upwardly and downwardly having symmetry with respect to the gate lines 121.

Individual storage electrode lines 131 are disposed between adjacent pixel electrodes 190 and include pairs of seventh storage electrodes 135*a* and 135*b* overlapping the lower and upper pixel electrode portions 190*a* and 190*b*.

Individual pairs of drain electrodes 175*a* and 175*b* overlap a gate electrode 124 and have inversion symmetry with respect to a center line of the gate lines 121. The pairs of drain electrodes 175*a* and 175*b* include expansions overlapping the pairs of seventh storage electrodes 135*a* and 135*b*.

Individual source electrodes 173 enclose a pair of drain electrodes 175*a* and 175*b* having a shape like a character "H."

The present invention can be employed to any display devices including LCD and OLED display.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A thin film transistor array panel comprising:
   a gate line including a gate electrode;
   a data line intersecting the gate line and including a source electrode;
   a drain electrode that is disposed apart from the source electrode and comprises first and second portions electrically connected to each other, wherein the first portion is a portion overlapping the gate electrode and the second portion is a portion overlapping the gate electrode, and the first and the second portions are spaced apart from each other and are extended substantially parallel to each other;
   a semiconductor layer connected to the source electrode and the drain electrode;
   a passivation layer formed on the gate line, the data line, the drain electrode, and the semiconductor layer; and
   a pixel electrode connected to the drain electrode,
   wherein the source electrode comprises first and second concave portions that are connected to each other and opened toward opposite directions against each other,
   the first and second portions of the drain electrode are separated by the source electrode, and
   the first and second concave portions enclose first and second portions of the drain electrode, respectively, and the first and second concave portions form an "S" shape.

2. The thin film transistor of claim 1, wherein the first and second concave portions have a rotational symmetry with respect to an intermediate point disposed between the first and second concave portions.

3. The thin film transistor of claim 2, wherein the first concave portion substantially coincides with the second concave portion when the first concave portion is rotated by about 180 degrees with respect to the intermediate point.

4. The thin film transistor of claim 1, wherein the gate electrode has a shape of a bar having first and second edges that oppose substantially parallel to each other and meet the first and second portions of the drain electrode, respectively.

5. The thin film transistor of claim 4, wherein the extension directions of the first and second portions of the drain electrode make substantially a right angle with the first and second edges of the gate electrode.

6. The thin film transistor of claim 5, wherein an overlapping area made by the first portion of the drain electrode and the first edge of the gate electrode starts from the first edge of the gate electrode in a first direction, and an overlapping area made by the second portion of the drain electrode and the second edge of the gate electrode starts from the second edge of the gate electrode in a second direction opposing the first direction.

7. A thin film transistor array panel comprising:
   a gate line including a gate electrode;
   a data line intersecting the gate line and including a source electrode;
   a drain electrode that is disposed apart from the source electrode and comprises first and second portions electrically connected to each other, extending substantially parallel to each other, and disposed opposite each other with respect to the source electrode;
   a semiconductor layer connected to the source electrode and the drain electrode;
   a passivation layer formed on the gate line, the data line, the drain electrode, and the semiconductor layer; and
   a pixel electrode connected to the drain electrode, wherein the source electrode includes
   first, second, third, fourth and fifth portions,
   the first and second portions of the source electrode are connected to respective ends of the third portion of the source electrode and extend in opposite directions, and
   the fourth and fifth portions of the source electrode extend from of the first and second portions in opposite directions, respectively,
   wherein the first, second, third, fourth and fifth portions of the source electrode have a rotational symmetry with respect to a reference point on the third portion of the source electrode.

8. The thin film transistor of claim 7, wherein the first portion of the source electrode substantially coincides with the second portion of the source electrode when the first portion of the source electrode is rotated by about 180 degrees with respect to the reference point.

9. The thin film transistor of claim 8, wherein the extension directions of the first and second portions are substantially parallel to each other.

10. The thin film transistor of claim 7, wherein the first portion of the drain electrode is enclosed by the first and third portions of the source electrode, and
    the second portion of the drain electrode is enclosed by the second and third portions of the source electrode.

11. The thin film transistor of claim 7, wherein the gate electrode has a shape of a bar having first and second edges that oppose substantially parallel to each other and meet the first and second portions of the drain electrode, respectively.

12. The thin film transistor of claim 11, wherein the extension directions of the first and second portions of the drain electrode make substantially a right angle with the first and second edges of the gate electrode.

13. The thin film transistor of claim 12, wherein an overlapping area made by the first portion of the drain electrode and the first edge of the gate electrode starts from the first edge of the gate electrode in a first direction, and an overlapping area made by the second portion of the drain electrode and the second edge of the gate electrode starts from the second edge of the gate electrode in a second direction opposing the first direction.

14. The thin film transistor of claim 7, wherein the third portion is a common edge to both the first and second portions.

15. A thin film transistor array panel comprising:
a gate line including a gate electrode;
a data line including a source electrode,
a drain electrode, wherein the drain electrode includes first and second portions spaced apart from each other;
wherein the source electrode includes first and second concave portions that are connected to each other and opened toward opposite directions against each other, and wherein the first and second portion of the drain electrode are positioned in the first and second concave portions, respectively.

16. The thin film transistor array panel of claim 15, wherein the first and the second concave portions of the source electrode form an "S" shape.

17. The thin film transistor array panel of claim 16, wherein the first and the second concave portions enclose the first and the second portions of the drain electrode, respectively.

18. The thin film transistor array panel of claim 16, wherein the first and second portions are extended substantially parallel to each other.

19. The thin film transistor array panel of claim 18, wherein the first and the second concave portions enclose the first and the second portions of the drain electrode, respectively.

20. The thin film transistor array panel of claim 15, wherein the first and the second portions are extended substantially parallel to each other.

21. The thin film transistor array panel of claim 20, wherein the first and the second concave potions enclose the first and the second portions of the drain electrode, respectively.

22. The thin film transistor array panel of claim 15, wherein the first and the second concave portions enclose the first and the second portions of the drain electrode, respectively.

23. A thin film transistor array panel comprising:
a gate line including a gate electrode;
a data line including a source electrode, wherein the source electrode includes first, second, third, fourth and fifth portions, the first and the second portions of the source electrode are connected to respective ends of the third portion of the source electrode and extend in opposite directions, and the fourth and the fifth portions of the source electrode extend from ends of the first and the second portions in opposite directions, respectively;
a drain electrode that is disposed apart from the source electrode and includes first and second portions, wherein the first portion is a portion overlapping the gate electrode and the second portion is a portion overlapping the gate electrode, and the first and the second portions are spaced apart from each other and are extended substantially parallel to each other;
a semiconductor layer connected to the source electrode and the drain electrode; and
a gate insulting layer disposed between the gate electrode and the semiconductor layer, wherein the first portion of the drain electrode is disposed between the third portion and the fourth portion if the source electrode, and the second portion of the drain electrode is disposed between the third portion and the fifth portion of the source electrode.

24. The thin film transistor of claim 23, further comprising:
a passivation layer disposed on the gate line, the data line, the drain electrode, and the semiconductor layer; and
a pixel electrode connected to the drain electrode.

25. A thin film transistor array panel comprising:
a gate line including a gate electrode;
a data line including a source electrode,
a first drain electrode portion; and
a second drain electrode portion spaced apart from the first drain electrode portion, wherein the source electrode includes first and second concave portions that are connected to each other and opened toward opposite directions against each other, and wherein the first drain electrode portion and the second drain electrode portion are positioned in the first and second concave portions, respectively.

* * * * *